(12) United States Patent
Kim et al.

(10) Patent No.: US 10,921,917 B2
(45) Date of Patent: Feb. 16, 2021

(54) INPUT SENSING CIRCUIT AND DISPLAY MODULE HAVING THE SAME

(71) Applicant: Samsung Display Co., Ltd., Yongin-Si (KR)

(72) Inventors: Hyungbae Kim, Hwaseong-si (KR); Sunghyun Park, Yongin-si (KR); Hyun-Wook Cho, Seongnam-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/730,554

(22) Filed: Dec. 30, 2019

(65) Prior Publication Data

US 2020/0210012 A1 Jul. 2, 2020

(30) Foreign Application Priority Data

Jan. 2, 2019 (KR) .................. 10-2019-0000429

(51) Int. Cl.
*G06F 3/041* (2006.01)
*H01L 27/32* (2006.01)
*G06F 3/044* (2006.01)

(52) U.S. Cl.
CPC .......... *G06F 3/0412* (2013.01); *H01L 27/323* (2013.01); *H01L 27/3246* (2013.01); *H01L 27/3276* (2013.01); *G06F 3/0448* (2019.05); *G06F 2203/04111* (2013.01); *G06F 2203/04112* (2013.01)

(58) Field of Classification Search
CPC ...... G06F 3/0412; G06F 3/044–3/0448; G06F 2203/04111; G06F 2203/04112
See application file for complete search history.

(56) References Cited

U.S. PATENT DOCUMENTS

| 8,653,834 | B2 * | 2/2014 | Reynolds | H03K 17/962 |
| | | | | 324/658 |
| 9,971,467 | B2 * | 5/2018 | Park | G06F 3/0445 |
| 10,175,783 | B2 * | 1/2019 | Lee | G06F 3/0446 |
| 10,353,501 | B2 * | 7/2019 | Akimoto | H01L 27/323 |
| 10,365,744 | B2 * | 7/2019 | Lee | G06F 3/0446 |
| 10,437,405 | B2 * | 10/2019 | Chen | G06F 3/0448 |
| 10,572,060 | B2 * | 2/2020 | Lee | H01L 27/323 |
| 10,761,665 | B2 | 9/2020 | Park | |
| 2012/0306777 | A1 | 12/2012 | Kang et al. | |
| 2014/0098057 | A1 * | 4/2014 | Lee | G06F 3/0446 |
| | | | | 345/174 |
| 2017/0075461 | A1 | 3/2017 | Orita et al. | |
| 2018/0032188 | A1 | 2/2018 | Park et al. | |
| 2018/0033833 | A1 | 2/2018 | An et al. | |

(Continued)

FOREIGN PATENT DOCUMENTS

JP 6325085 B2 5/2018
KR 10-2012-0133848 A 12/2012

(Continued)

*Primary Examiner* — Gene W Lee
(74) *Attorney, Agent, or Firm* — Innovation Counsel LLP

(57) ABSTRACT

An input sensing circuit includes a first conductive pattern, a second conductive pattern, and an insulating layer disposed between the first conductive pattern and the second conductive pattern. At least some of wires forming the second conductive pattern overlap some of wires forming the first conductive pattern. The wires of the second conductive pattern overlapping the wires of the first conductive pattern are in a floating state.

20 Claims, 14 Drawing Sheets

(56) References Cited

U.S. PATENT DOCUMENTS

| | | | |
|---|---|---|---|
| 2018/0059837 A1 | 3/2018 | Kim et al. | |
| 2018/0292927 A1* | 10/2018 | Chu | G06F 3/044 |
| 2018/0348912 A1* | 12/2018 | Lee | G06F 3/04166 |
| 2019/0018518 A1* | 1/2019 | Choi | G06F 3/0446 |
| 2019/0056821 A1* | 2/2019 | Choi | G06F 3/0443 |
| 2019/0155417 A1* | 5/2019 | Lee | G06F 3/0443 |
| 2019/0204952 A1* | 7/2019 | Han | H01L 27/3246 |
| 2020/0026393 A1* | 1/2020 | Gourevitch | G06F 3/0448 |
| 2020/0192525 A1* | 6/2020 | Li | G06F 3/0446 |

FOREIGN PATENT DOCUMENTS

| | | |
|---|---|---|
| KR | 10-2018-0025389 A | 3/2018 |
| KR | 0-1913394 B1 | 10/2018 |
| KR | 10-2018-0014393 A | 10/2018 |
| KR | 10-2019-010157 A | 9/2019 |

\* cited by examiner

INPUT SENSING CIRCUIT AND DISPLAY MODULE HAVING THE SAME

CROSS-REFERENCE TO RELATED APPLICATION

This U.S. non-provisional patent application claims priority under 35 U.S.C. § 119 of Korean Patent Application No. 10-2019-0000429, filed on Jan. 2, 2019, the disclosure of which is hereby incorporated by reference in its entirety.

BACKGROUND

The present disclosure relates to an input sensing circuit and a display module having the input sensing circuit, and more particularly, to an input sensing circuit that can alleviate a short circuit phenomenon caused by an insulating film defect and a display module having the input sensing circuit.

In the information society, the importance of a display device comes to the fore as a visual information delivery medium. Examples of display devices include a liquid crystal display (LCD), a plasma display panel (PDP), an organic light emitting display (OLED), a field effect display (FED), and an electrophoretic display (EPD).

A display device includes a display panel that displays an image according to an electrical signal. The display device may include a touch screen for sensing a touch applied from outside the display panel.

The display device may include various electrode patterns that are activated by an electrical signal. A region in which the electrode patterns are activated may displays information and/or respond to a touch input applied from the outside.

SUMMARY

The present disclosure provides an input sensing circuit in which defects caused by a short circuit that may occur between wires forming the input sensing circuit are reduced, and a display module having the input sensing circuit.

An embodiment of the inventive concept provides an input sensing circuit including a base layer, a first conductive pattern, an insulating layer, and a second conductive pattern.

In an embodiment, the first conductive pattern may be disposed on the base layer and may include a first connection pattern, a second connection pattern spaced apart from the first connection pattern, and first to fourth sub-patterns, each of which is disposed adjacent to the first connection pattern or the second connection pattern, and is in a floating state.

In an embodiment, the insulating layer may be disposed above the base layer covering the first conductive pattern and may include a plurality of contact holes exposing both ends of the first connection pattern and both ends of the second connection pattern.

In an embodiment, the second conductive pattern may be disposed on the insulating layer.

In an embodiment, the second conductive pattern may include a plurality of first sensor patterns arranged in a first direction, a plurality of second sensor patterns arranged in a second direction crossing the first direction, and each of the plurality of second sensor patterns is electrically connected to the first connection pattern and the second connection pattern through some of the plurality of contact holes, a third connection pattern disposed between adjacent two of the plurality of second sensor patterns, and configured to electrically connect adjacent two of the plurality of first sensor patterns, and fifth to eighth sub-patterns, each of which is disposed between corresponding one of the plurality of first sensor patterns and the third connection pattern, and is in a floating state.

In an embodiment, each of the first to fourth sub-patterns may overlap at least one among one of the first sensor patterns and the third connection pattern.

In an embodiment, each of the fifth to eighth sub-patterns may overlap at least one of the first connection pattern and the second connection pattern.

In an embodiment, each of the first conductive pattern and the second conductive pattern may have a mesh shape having a plurality of openings defined therein.

In an embodiment, each of the fifth to eighth sub-patterns may be disposed at an outer position from wires included in the third connection pattern.

In an embodiment, each of the fifth to eighth sub-patterns may be disposed at an inner position from wires included in the third connection pattern.

In an embodiment, each of the first to eighth sub-patterns may extend in a third direction between the first direction and the second direction, or a fourth direction perpendicular to the third direction.

In an embodiment, at least some of wires included in each of the plurality of first sensor patterns, the plurality of second sensor patterns, the first connection pattern, the second connection pattern, and the third connection pattern may extend in the third direction or the fourth direction.

In an embodiment, the input sensing circuit may further include a first signal line connected to at least one of the plurality of first sensor patterns, a second signal line connected to at least one of the plurality of second sensor patterns, and an input sensing driver configured to provide an electrical signal to the first signal line and the second signal line.

In an embodiment of the inventive concept, an input sensing circuit includes a first conductive pattern, an insulating layer, and a second conductive pattern.

In an embodiment, the first conductive pattern may include a first connection pattern, a second connection pattern spaced apart from the first connection pattern, and first to fourth sub-patterns, each of which is disposed adjacent to the first connection pattern or the second connection pattern, and is in a floating state.

In an embodiment, the insulating layer may be disposed below the first conductive pattern and may include a plurality of contact holes overlapping both ends of the first connection pattern and both ends of the second connection pattern.

In an embodiment, the second conductive pattern may be disposed below the insulating layer.

In an embodiment, the second conductive pattern may include a plurality of first sensor patterns arranged in a first direction, a plurality of second sensor patterns arranged in a second direction crossing the first direction, and each of the plurality of second sensor patterns is electrically connected to the first connection pattern and the second connection pattern through some of the plurality of contact holes, a third connection pattern disposed between adjacent two of the plurality of second sensor patterns, and configured to electrically connect adjacent two of the plurality of first sensor patterns, and fifth to eighth sub-patterns, each of which is disposed between corresponding one of the plurality of first sensor patterns and the third connection pattern, and is in a floating state.

In an embodiment of the inventive concept, a display module includes a display panel having a light emitting element layer containing a light emitting element, and an encapsulation layer sealing the light emitting element layer, and an input sensing circuit disposed on the display panel.

In an embodiment, the input sensing circuit may include a first conductive pattern disposed on the encapsulation layer, an insulating layer covering the first conductive pattern, and a second conductive pattern disposed on the insulating layer.

In an embodiment, the first conductive pattern may include a first connection pattern, a second connection pattern spaced apart from the first connection pattern, and first to fourth sub-patterns, each of which is disposed adjacent to the first connection pattern or the second connection pattern, and is in a floating state.

In an embodiment, the insulating later may include a plurality of contact holes exposing at least a portion of the first connection pattern and at least a portion of the second connection pattern.

In an embodiment, the second conductive pattern may include a plurality of first sensor patterns arranged in a first direction, a plurality of second sensor patterns arranged in a second direction crossing the first direction, and each of the plurality of second sensor patterns is electrically connected to the first connection pattern and the second connection pattern through some of the plurality of contact holes, a third connection pattern disposed between adjacent two of the plurality of second sensor patterns, and configured to electrically connect adjacent two of the plurality of first sensor patterns, and fifth to eighth sub-patterns each of which is disposed between corresponding one of the plurality of first sensor patterns and the third connection pattern, and is in a floating state.

BRIEF DESCRIPTION OF THE FIGURES

The accompanying drawings are included to provide further understanding of the present disclosure, and are incorporated in and form a part of the present disclosure. The drawings illustrate exemplary embodiments of the present disclosure and, together with the description, serve to describe principles of the inventive concept. In the drawings.

DETAILED DESCRIPTION

Hereinafter, the present disclosure will be explained in detail with reference to the accompanying drawings.

In the figures, the ratios and dimensions of elements may be exaggerated for effective description of the technical contents. As used herein, the term "and/or" includes any and all combinations of one or more of the associated listed items.

It will be further understood that the terms "include" and/or "including," when used in the present disclosure, specify the presence of stated features, integers, steps, operations, elements, and/or components, but do not preclude the presence or addition of one or more other features, integers, steps, operations, elements, components, and/or groups thereof.

Figure 1:
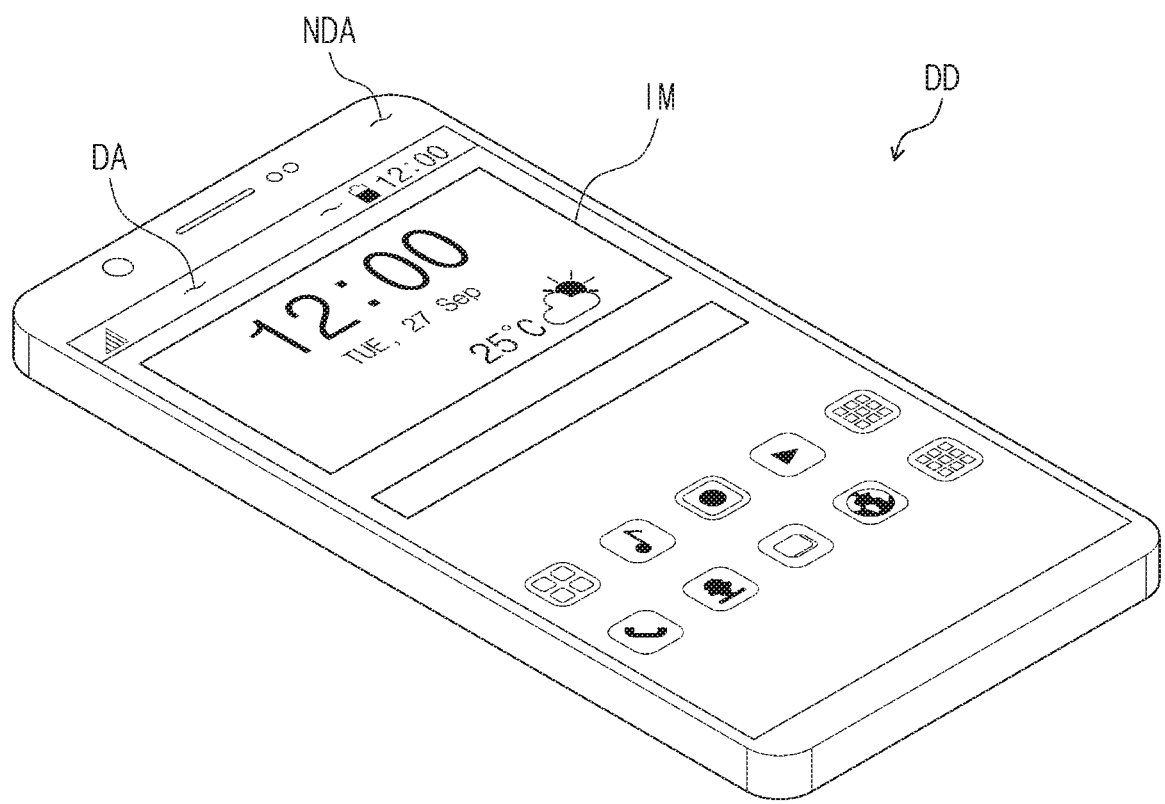
FIG. 1 is a perspective view of a display device according to an embodiment of the inventive concept.
Figure 1:
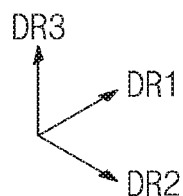

FIG. 1 is a perspective view of a display device DD according to an embodiment of the inventive concept.

The display device DD is exemplarily illustrated as a smartphone in FIG. 1. However, the display device DD is not limited thereto, and may be a large-sized electronic device such as a television and a monitor, or a medium- and small-sized electronic device such as a mobile phone, a tablet computer, a car navigation device, a game machine, and a smart watch.

The display device DD may have a display region DA and a non-display region NDA.

The display region DA in which an image IM is displayed is parallel to a plane defined by a first direction axis DR1 and a second direction axis DR2. A normal direction of the display region DA, that is, a thickness direction of the display device DD is indicated by a third direction axis DR3. The front surface (or the top surface) and the rear surface (or the bottom surface) of each member of the display device DD may be distinguished by the third direction axis DR3. However, directions that the first to third direction axes DR1 to DR3 indicate are a relative concept, and may be converted into other directions. Hereinafter, first to third directions are respectively indicated by the first to third direction axes DR1 to DR3, and refer to the same reference numerals.

The shape of the display region DA illustrated in FIG. 1 is an example, and may be modified in various ways and configurations without limitation as necessary.

The non-display region NDA is adjacent to the display region DA, and corresponds to a region in which the image IM is not displayed. For example, the non-display region NDA may correspond to a bezel region of the display device DD.

The non-display region NDA may surround the display region DA. However, the shapes and sizes of the display region DA and the non-display region NDA are not limited to the present example illustrated in FIG. 1, and may be designed relative to each other.

FIGS. 2A to 2D are cross-sectional views of display devices DD according to an embodiment of the inventive concept. FIGS. 2A to 2D illustrate cross sections defined by the second direction axis DR2 and the third direction axis DR3. The cross-sectional views are schematically illustrated in FIGS. 2A to 2D to illustrate the lamination relationship of a panel and/or members of the display device DD.

Figure 2A:
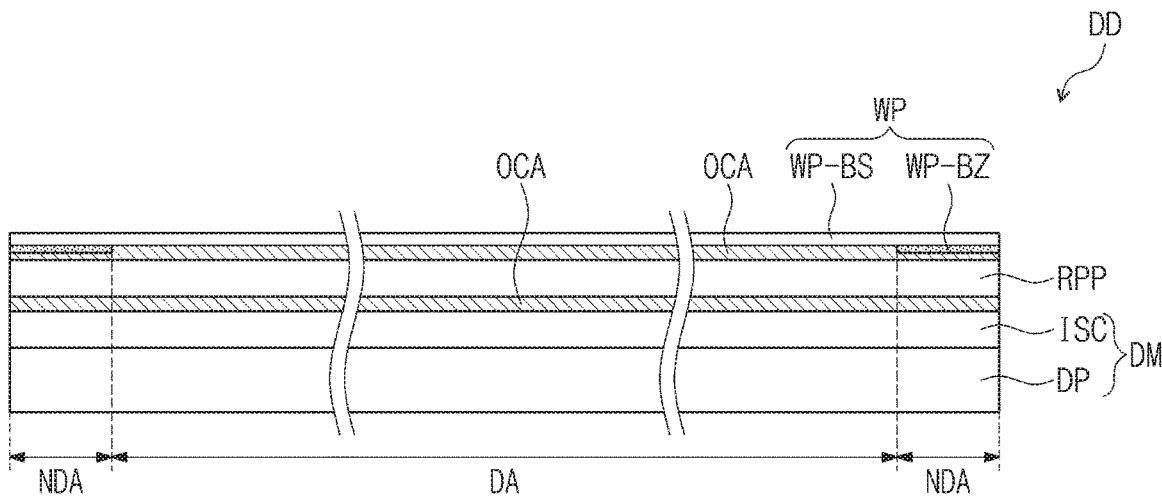
FIGS. 2A, 2B, 2C, and 2D are each a cross-sectional view of a display device according to an embodiment of the inventive concept.

Referring to FIG. 2A, a display device DD may include a display panel DP, an input sensing circuit ISC, an anti-reflection member RPP, and a window member WP. The input sensing circuit ISC may be directly disposed on the display panel DP. In the present disclosure, a phrase of "directly disposed" means that no separate adhesive layer/member is disposed between two elements.

A display module DM may include the display panel DP and the input sensing circuit ISC that is directly disposed on the display panel DP. Optically clear adhesive members OCA are respectively disposed between the display module DM and the anti-reflection member RPP, and between the anti-reflection member RPP and the window member WP.

The display panel DP generates an image, and the input sensing circuit ISC obtains sensing information of an external input (e.g., a coordinate of a touch event or an applied pressure). Although not separately illustrated, the display module DM according to an embodiment of the inventive concept may further include a protective member that is disposed on a bottom surface of the display panel DP. The protective member and the display panel DP may be bonded by an adhesive member. The display devices DD illustrated in FIGS. 2B to 2D to be described later may further include a protective member, too.

The display panel DP according to an embodiment of the inventive concept may be a light emitting display panel. For example, the display panel DP may be an organic light emitting display panel, a quantum dot light emitting display panel, or a micro-LED display panel. A light emitting layer of the organic light emitting display panel may include an organic light emitting material. A light emitting layer of the quantum dot light emitting display panel may include a quantum dot, a quantum rod, and/or the like. Hereinafter, the organic light emitting display panel is described as an example of the display panel DP, however, it is understood that the display panel DP is not limited thereto, and any other types of the display panel may be applied without deviating from the scope of the present disclosure.

The anti-reflection member RPP reduces the reflectance of external light incident from above the window member WP. The anti-reflection member RPP according to an embodiment of the inventive concept may include a phase retarder and a polarizer.

The anti-reflection member RPP according to an embodiment of the inventive concept may include color filters.

The window member WP according to an embodiment of the inventive concept includes a base film WP-BS and a light shielding pattern WP-BZ. The base film WP-BS may include glass and/or a synthetic resin. The base film WP-BS is not limited to a single layer. For example, the base film WP-BS may include two or more films bonded by an adhesive member.

The light shielding pattern WP-BZ partly overlaps the base film WP-BS. The light shielding pattern WP-BZ may be disposed on a rear surface of the base film WP-BS and may define the bezel region that corresponds to the non-display region NDA of the display device DD.

Hereinafter, the light shielding pattern WP-BZ and the base film WP-BS are not separately illustrated in FIGS. 2B to 2D for the convenience of illustration.

Figure 2B:
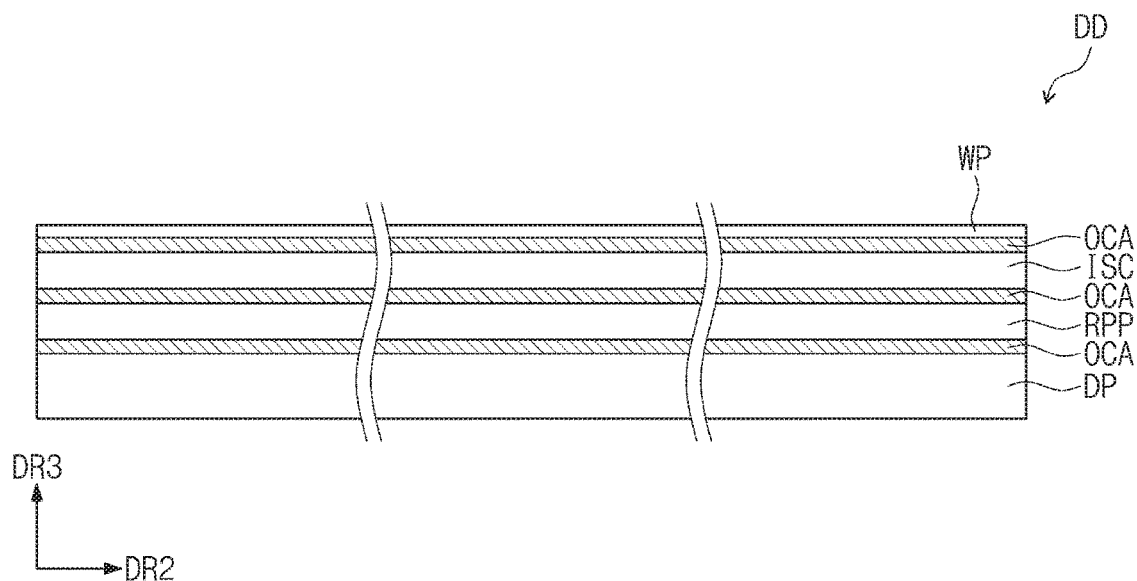

Referring to FIG. 2B, a display device DD may include a display panel DP, an anti-reflection member RPP, an input sensing circuit ISC, and a window member WP.

The display panel DP and the anti-reflection member RPP may be bonded by a first layer of an optically clear adhesive member OCA. The anti-reflection member RPP and the input sensing circuit ISC may be bonded by a second layer of the optically clear adhesive member OCA. The input sensing circuit ISC and the window member WP may be bonded by a third layer of the optically clear adhesive member OCA.

Figure 2C:
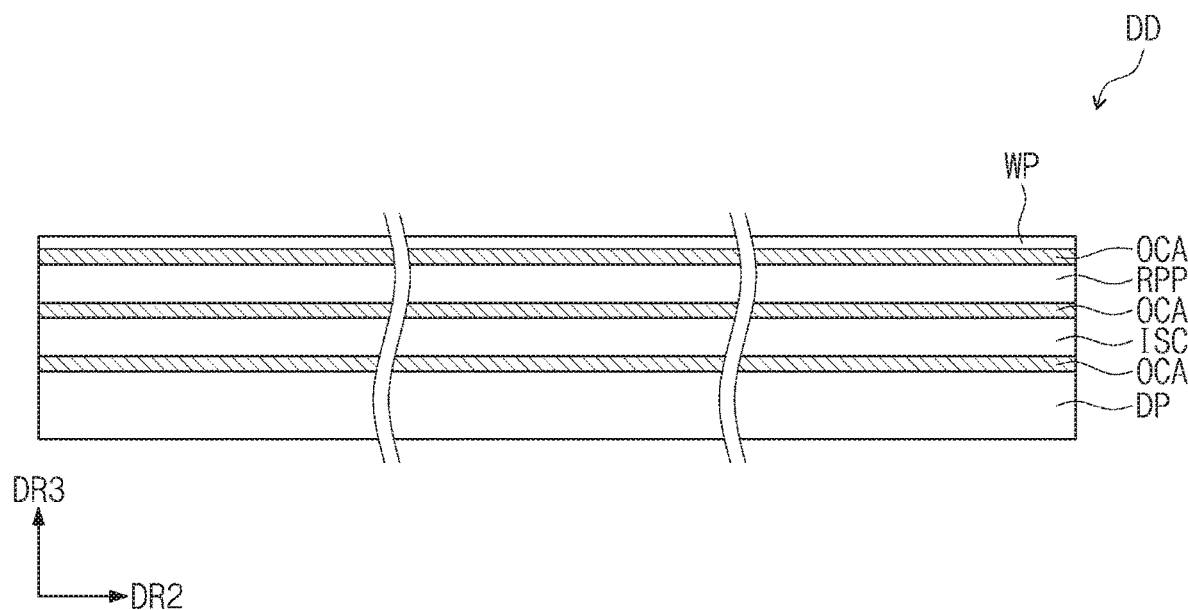

Referring to FIG. 2C, the positions of an anti-reflection member RPP and an input sensing circuit ISC are reversed from the laminated structure illustrated in FIG. 2B.

The optically clear adhesive member OCA may have predetermined elasticity. Due to the elasticity of the optically clear adhesive member OCA, the input sensing circuit ISC may be deformed in the third direction DR3 when an external pressure is applied thereto.

Figure 2D:
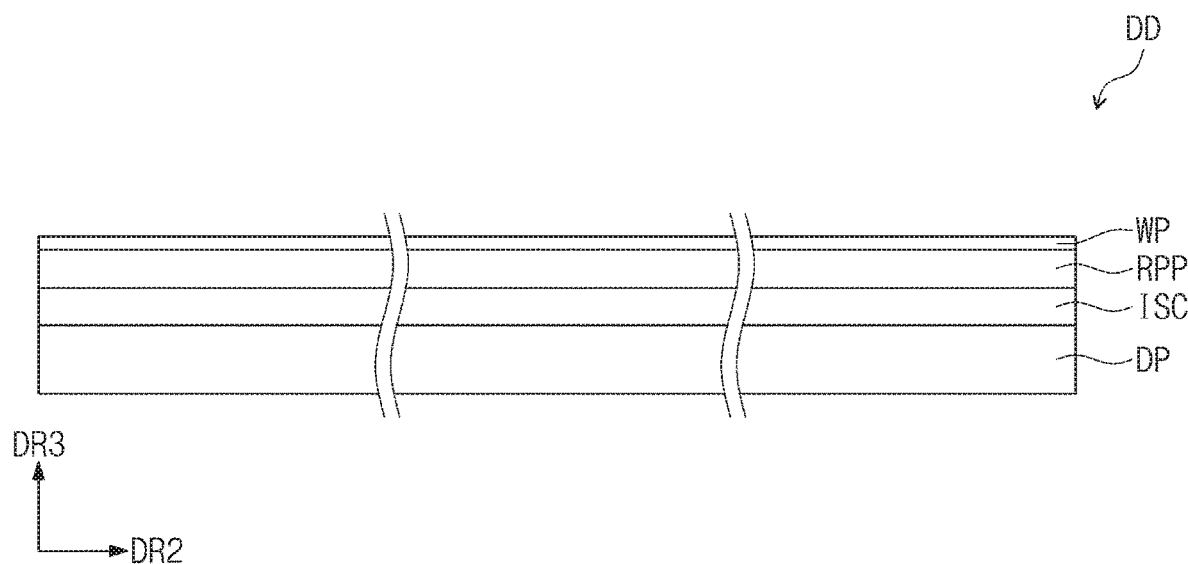

Referring to FIG. 2D, a display panel DP, an input sensing circuit ISC, an anti-reflection member RPP, and a window member WP may be formed in a display device DD in a continuous process with adhesive members omitted. In another embodiment of the inventive concept, the laminating order of the input sensing circuit ISC and the anti-reflection member RPP may be changed without deviating from the scope of the present disclosure.

The input sensing circuit ISC may be a circuit for sensing a touch input of a user, or a pressure applied from the outside.

Figure 3:
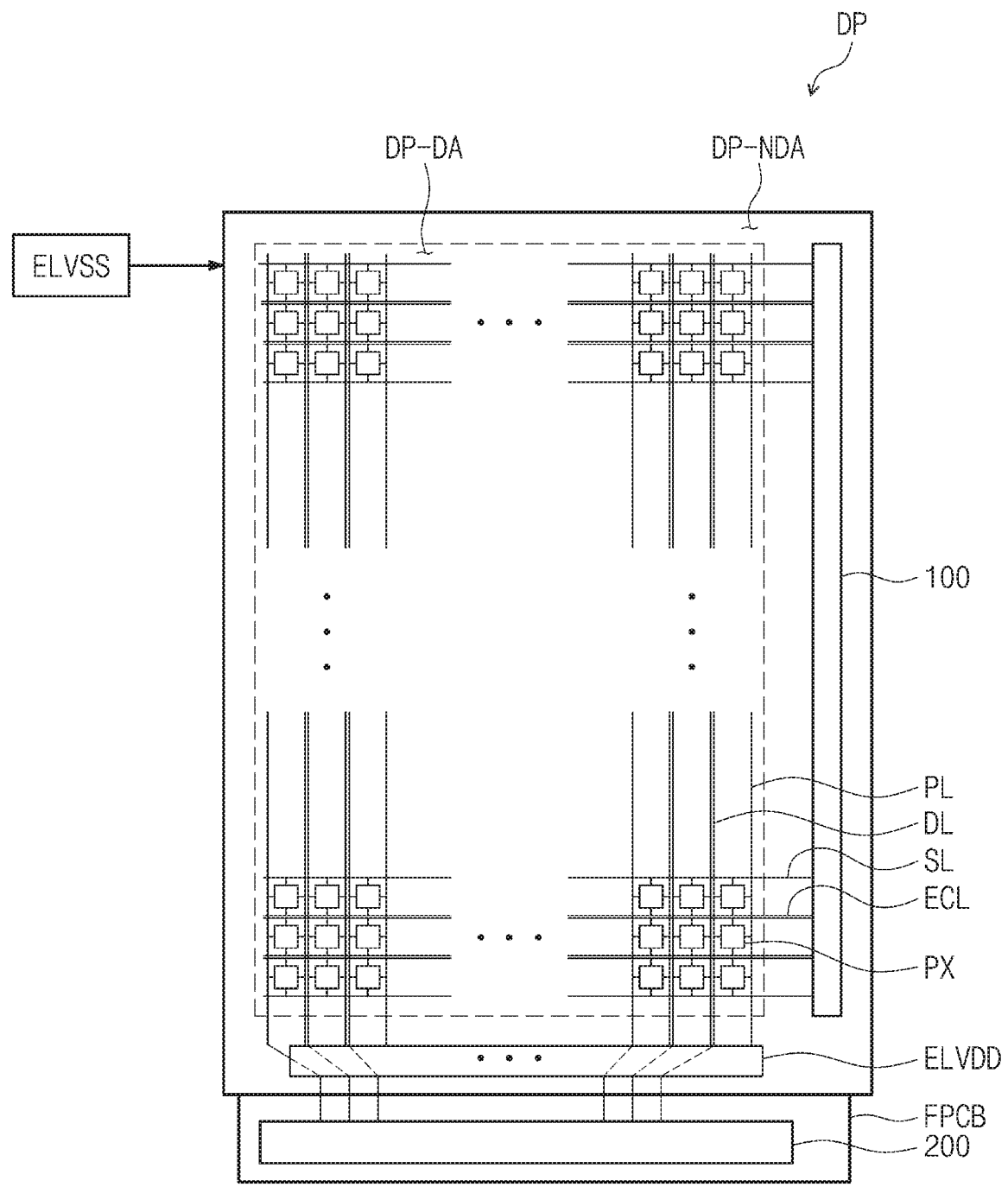
FIG. 3 is a plan view of a display panel according to an embodiment of the inventive concept.
Figure 3:
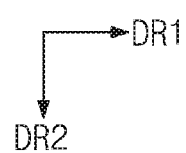

FIG. 3 is a plan view of the display panel DP according to an embodiment of the inventive concept.

The display panel DP includes a display region DP-DA and a non-display region DP-NDA when viewed in a plane. In this embodiment, the non-display region DP-NDA may be defined along an edge of the display region DP-DA. The display region DP-DA and the non-display region DP-NDA of the display panel DP may respectively correspond to the display region DA and the non-display region NDA of the display device DD illustrated in FIG. 1.

The display panel DP may include a scan driver 100, a data driver 200, a plurality of scan lines SL, a plurality of light emission control lines ECL, a plurality of data lines DL, a plurality of power lines PL, and a plurality of pixels PX (hereinafter referred to as pixels PX). The pixels PX are arranged in the display region DP-DA. Each of the pixels PX may include an organic light emitting element OLED (see FIG. 4) and a pixel circuit CC (see FIG. 4) that is connected to the organic light emitting element OLED.

The scan driver 100 may include a scan signal driver and a light emission control driver.

The scan signal driver generates scan signals and sequentially outputs the generated scan signals to the scan lines SL. The light emission control driver generates light emission control signals and outputs the generated light emission control signals to the light emission control lines ECL.

In another embodiment of the inventive concept, the scan signal driver and the light emission control driver may not be divided, but may be formed as a single circuit within the scan driver 100.

The scan driver 100 may include a plurality of thin film transistors formed through the same process as that of forming a driving circuit of the pixels PX, for example, a low temperature polycrystalline silicon (LTPS) process or a low temperature polycrystalline oxide (LTPO) process.

The data driver 200 outputs data signals to the data lines DL. The data signals are analog voltage signals corresponding to gradation values of the image data.

In an embodiment of the inventive concept, the data driver 200 may be mounted on a printed circuit board FPCB, and the printed circuit board FPCB may be connected to pads arranged at one-side ends of the data lines DL. However, the data driver 200 is not limited thereto, and the data driver 200 may be directly mounted on the display panel DP.

The scan lines SL may extend in the first direction DR1 and may be arranged in the second direction DR2.

The light emission control lines ECL may extend in the first direction DR1 and may be arranged in the second direction DR2. In one embodiment, each of the light emission control lines ECL may be disposed side by side with a corresponding scan line of the scan lines SL.

The data lines DL may extend in the second direction DR2 and may be arranged in the first direction DR1. The data lines DL may provide the data signals to corresponding pixels PX.

The power lines PL may extend in the second direction DR2 and may be arranged in the first direction DR1. The power lines PL may provide a voltage of a first power source ELVDD to corresponding pixels PX.

Each of the plurality of pixels PX is connected to a corresponding scan line of the scan lines SL, a corresponding light emission control line of the light emission control lines ECL, a corresponding data line of the data lines DL, and a corresponding power line of the power lines PL.

Figure 4:
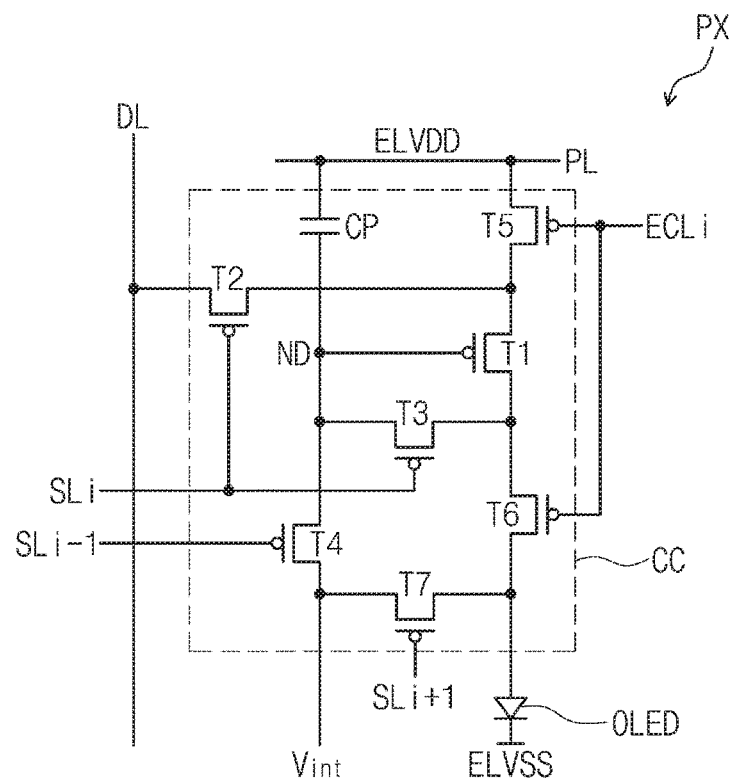
FIG. 4 is an equivalent circuit diagram of a pixel according to an embodiment of the inventive concept.
Figure 5:
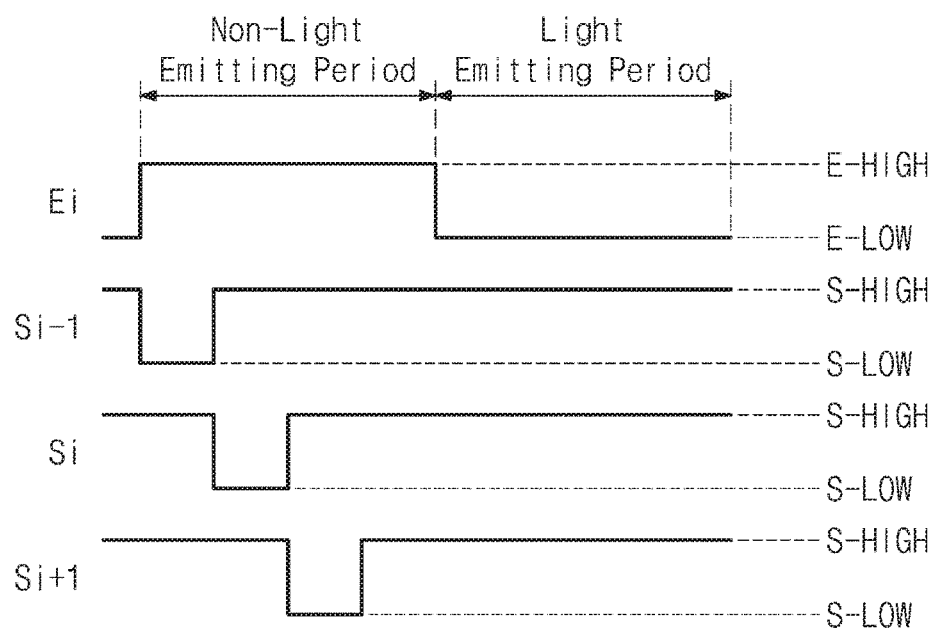
FIG. 5 illustrates, by way of an example, signals applied to the pixel illustrated in FIG. 4.

FIG. 4 is an equivalent circuit diagram of a pixel PX according to an embodiment of the inventive concept. FIG. 5 illustrates, by way of an example, a light emission control signal Ei, and scan signals Si−1, Si, and Si+1 applied to the pixel PX illustrated in FIG. 4. The pixel PX connected to an i-th scan line SLi and an i-th light emission control line ECLi is illustrated in FIG. 4 by way of an example.

The pixel PX may include the organic light emitting element OLED and the pixel circuit CC. The pixel circuit CC may include a plurality of transistors T1 to T7, and a capacitor CP. The pixel circuit CC controls the amount of current flowing through the organic light emitting element OLED in response to a data signal provided from a data line DL.

The organic light emitting element OLED may emit light having a predetermined luminance in response to the amount of the current provided from the pixel circuit CC. To this end, the level of a voltage of the first power source ELVDD may be set to be higher than that of a second power source ELVSS so that light emits when current flows through the organic light emitting element OLED.

Each of the plurality of transistors T1 to T7 may include an input electrode (or a source electrode), an output electrode (or a drain electrode), and a control electrode (or a gate electrode). For convenience, one of the input electrode and the output electrode may be referred to as a first electrode and the other as a second electrode in the present disclosure.

A first electrode of a first transistor T1 is connected to the first power source ELVDD via a fifth transistor T5, and a second electrode of the first transistor T1 is connected to an anode of the organic light emitting element OLED via a sixth transistor T6. The first transistor T1 may be referred to as a driving transistor in the present disclosure.

The first transistor T1 controls the amount of current flowing through the organic light emitting element OLED in response to a voltage applied to a control electrode of the first transistor T1.

A second transistor T2 is connected between the data line DL and the first electrode of the first transistor T1. A control electrode of the second transistor T2 is connected to the i-th scan line SLi. The second transistor T2 is turned on when an i-th scan signal Si is provided to the i-th scan line SLi and electrically connects the data line DL to the first electrode of the first transistor T1.

A third transistor T3 is connected between the second electrode and the control electrode of the first transistor T1. A control electrode of the third transistor T3 is connected to the i-th scan line SLi. The third transistor T3 is turned on when the i-th scan signal Si is provided to the i-th scan line SLi and electrically connects the second electrode and the control electrode of the first transistor T1. Accordingly, the first transistor T1 is connected in the form of a diode (herein also referred to as "diode-connected") when the third transistor T3 is turned on.

A fourth transistor T4 is connected between a node ND and an initialization power generator (not illustrated) that provides an initialization voltage Vint. A control electrode of the fourth transistor T4 is connected to an (i−1)-th scan line SLi−−1. The fourth transistor T4 is turned on when an (i−1)-th scan signal Si−1 is provided to the (i−1)-th scan line SLi−1 and provides the initialization voltage Vint to the node ND.

The fifth transistor T5 is connected between a power line PL and the first electrode of the first transistor T1. A control electrode of the fifth transistor T5 is connected to the i-th light emission control line ECLi.

The sixth transistor T6 is connected between the second electrode of the first transistor T1 and the anode of the organic light emitting element OLED. A control electrode of the sixth transistor T6 is connected to the i-th light emission control line ECLi.

A seventh transistor T7 is connected between the initialization power generator (not illustrated) and the anode of the organic light emitting element OLED. A control electrode of the seventh transistor T7 is connected to an (i+1)-th scan line SLi+1. The seventh transistor T7 is turned on when an (i+1)-th scan signal Si+1 is provided to the (i+1)-th scan line SLi+1 and provides the initialization voltage Vint to the anode of the organic light emitting element OLED.

The seventh transistor T7 may improve black display capability of the pixel PX. Specifically, a parasitic capacitor (not illustrated) of the organic light emitting element OLED is discharged when the seventh transistor T7 is turned on. Then, when black luminance is implemented, the organic light emitting element OLED may not emit light due to a leakage current provided from the first transistor T1, and thus the black display capability of the pixel PX may be improved.

In addition, although the control electrode of the seventh transistor T7 is illustrated as being connected to the (i+1)-th scan line SLi+1 in FIG. 4, an embodiment of the inventive concept is not limited thereto. In another embodiment of the inventive concept, the control electrode of the seventh transistor T7 may be connected to the i-th scan line SLi or the (i−1)-th scan line SLi−1.

The transistors T1 to T7 included in the pixel PX as illustrated in FIG. 4 are p-type metal-oxide-semiconductor (PMOS) transistors, but the present disclosure is not limited thereto. In another embodiment of the inventive concept, the transistors T1 to T7 included in the pixel PX may be n-type metal-oxide-semiconductors (NMOS) transistors. In another embodiment of the inventive concept, the pixel PX may be formed of a combination of NMOS and PMOS transistors.

The capacitor CP is disposed between the power line PL and the node ND. A voltage corresponding to a data signal is charged at the capacitor CP. The amount of current flowing through the first transistor T1 may be determined depending on the voltage charged in the capacitor CP when the fifth transistor T5 and the sixth transistor T6 are turned on.

In an embodiment of the inventive concept, the configuration of the pixel PX is not limited to the configuration illustrated in FIG. 4. In another embodiment of the inventive concept, the pixel PX may be implemented in various configurations for emitting light in the organic light emitting element OLED.

Referring to FIG. 5, the light emission control signal Ei may transition between a first level E-HIGH and a second level E-LOW. Each of the scan signals Si−1, Si, and Si+1 may transition between a first level S-HIGH and a second level S-LOW.

When the light emission control signal Ei is at the first level E-HIGH, and the fifth transistor T5 and the sixth transistor T6 are turned off. When the fifth transistor T5 is turned off, the power line PL and the first electrode of the first transistor T1 are electrically disconnected. When the sixth transistor T6 is turned off, the second electrode of the first transistor T1 and the anode of the organic light emitting element OLED are electrically disconnected. Accordingly, while the light emission control signal Ei having the first level E-HIGH is provided to the i-th light emission control line ECLi, the organic light emitting element OLED does not emit light. This period is defined as a non-light emitting period.

During the non-light emitting period, the scan signals Si−1, Si, and Si+1 sequentially transition between the first level S-HIGH and the second level S-LOW. When the (i−1)-th scan signal Si−1 provided to the (i−1)-th scan line SLi−1 has the second level S-LOW, the fourth transistor T4 is turned on. When the fourth transistor T4 is turned on, the initialization voltage Vint is provided to the node ND, and the node ND is initialized at the initialization voltage Vint.

Thereafter, when the i-th scan signal Si provided to the i-th scan line SLi has the second level S-LOW, the second transistor T2 and the third transistor T3 are turned on.

When the second transistor T2 is turned on, a data signal received from the data line DL is provided to the first electrode of the first transistor T1. At this time, the first transistor T1 is turned on because the node ND is initialized at the initialization voltage Vint. When the first transistor T1 is turned on, a voltage corresponding to the data signal is provided to the node ND. At this time, the voltage corresponding to the data signal is charged to the capacitor CP.

Thereafter, when the (i+1)-th scan signal Si+1 provided to the (i+1)-th scan line SLi+1 has the second level S-LOW, the seventh transistor T7 is turned on.

When the seventh transistor T7 is turned on, the initialization voltage Vint is provided to the anode of the organic light emitting element OLED, so that a parasitic capacitor (not shown) of the organic light emitting element OLED may be discharged.

Thereafter, when the light emission control signal Ei provided to the light emission control line ECLi has the second level E-LOW, the fifth transistor T5 and the sixth transistor T6 are turned on. When the fifth transistor T5 is turned on, the voltage of the first power source ELVDD is provided to the first electrode of the first transistor T1. When the sixth transistor T6 is turned on, the second electrode of the first transistor T1 and the anode of the organic light emitting element OLED are electrically connected. Accordingly, the organic light emitting element OLED generates light of predetermined luminance in response to the amount of current flowing through the organic light emitting element OLED. This period is defined as a light emitting period.

Figure 6:
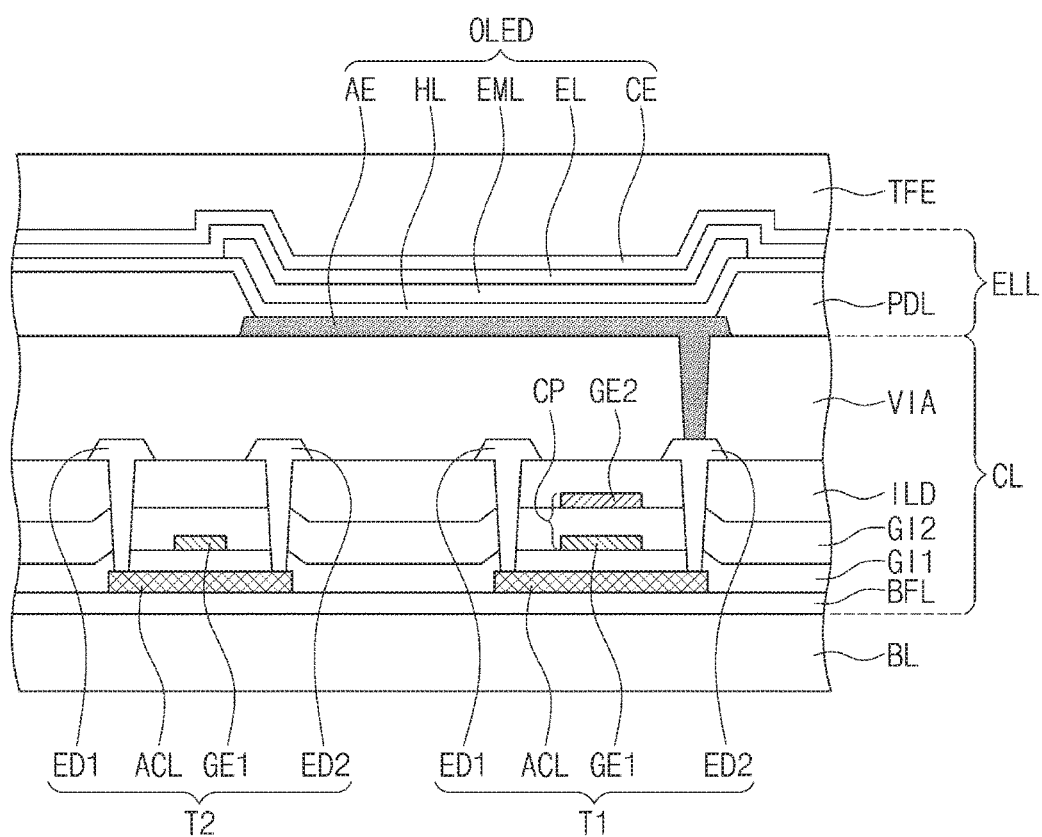
FIG. 6 is a cross-sectional view of a portion of the display panel including the pixel according to an embodiment of the inventive concept.

FIG. 6 is a cross-sectional view of a portion of the display panel DP including the pixel PX (see FIG. 4) according to an embodiment of the inventive concept. FIG. 6 illustrates the first transistor T1 and the second transistor T2 of the pixel PX by way of an example, however, the structures of the first transistor T1 and the second transistor T2 are not limited thereto. For example, in FIG. 6, a second electrode ED2 of the first transistor T1 is illustrated as coming in direct contact with an anode AE of the pixel PX, this is because a cross-sectional shape of the pixel PX is illustrated, and the first transistor T1 may be connected to the anode AE of the pixel PX via the sixth transistor T6 as illustrated in FIG. 4. However, an embodiment of the inventive concept is not limited thereto, and the second electrode ED2 of the first transistor T1 may come in direct contact with the anode AE of the pixel PX in another embodiment of the inventive concept.

The display panel DP (see FIG. 3) may include a base layer BL, a circuit layer CL, a light emitting element layer ELL, and an encapsulation layer TFE.

The circuit layer CL may include a buffer layer BFL, gate insulating layers GI1 and GI2, an interlayer insulating layer ILD, a circuit insulating layer VIA, and the first transistor T1 and the second transistor T2.

The light emitting element layer ELL may include the organic light emitting element OLED and a pixel defining film PDL.

The encapsulation layer TFE may seal the light emitting element layer ELL to protect the light emitting element layer ELL from external oxygen or moisture.

The buffer layer BFL is disposed on one surface of the base layer BL.

The buffer layer BFL prevents impurities present in the base layer BL from flowing into the pixel PX during a manufacturing process. In particular, the buffer layer BFL prevents impurities from diffusing into active portions ACL of the transistors T1 and T2 of the pixel PX.

Impurities may be introduced from the outside or may be generated by pyrolysis of the base layer BL. For example, impurities may be gas or sodium discharged from the base layer BL. In addition, the buffer layer BFL blocks moisture flowing into the pixel PX from the outside.

The active portions ACL of the transistors T1 and T2 are disposed on the buffer layer BFL. Each of the active portions ACL may include polysilicon or amorphous silicon. The active portions ACL may also include a metal oxide semiconductor.

The active portions ACL may include a channel region serving as a path through which electrons or holes may move, a first ion-doped region and a second ion-doped region that are disposed with the channel region interposed therebetween.

A first gate insulating layer GI1 covering the active portions ACL is disposed on the buffer layer BFL. The first gate insulating layer GI1 may include an organic film and/or an inorganic film. The first gate insulating layer GI1 may include a plurality of inorganic thin films. The plurality of inorganic thin films may include at least one silicon nitride layer and at least one silicon oxide layer.

Control electrodes GE1 of the transistors T1 and T2 are disposed on the first gate insulating layer GI1. The control electrode GE1 of the first transistor T1 may correspond to one electrode of the two electrodes of the capacitor CP. At least a portion of the scan lines SL (see FIG. 3) and the light emission control lines ECL (see FIG. 3) may be disposed on the first gate insulating layer GI1.

A second gate insulating layer GI2 covering the control electrodes GE1 is disposed on the first gate insulating layer GI1. The second gate insulating layer GI2 may include an organic film and/or an inorganic film. The second gate insulating layer GI2 may include a plurality of inorganic thin films. The plurality of inorganic thin films may include at least one silicon nitride layer and at least one silicon oxide layer.

The other electrode GE2 of the two electrodes of the capacitor CP (see FIG. 4) may be disposed on the second gate insulating layer GI2. Accordingly, the control electrode GE1 disposed on the first gate insulating layer GI1 and the electrode GE2 disposed on the second gate insulating layer GI2 may overlap each other with the second gate insulating layer GI2 interposed therebetween to form the capacitor CP as illustrated in FIG. 4. However, the electrode structure of the capacitor CP is not limited to the example illustrated in FIG. 6.

The interlayer insulating layer ILD covering the electrode GE2 is disposed on the second gate insulating layer GI2. The interlayer insulating layer ILD may include an organic film and/or an inorganic film. The interlayer insulating layer ILD may include a plurality of inorganic thin films. The plurality of inorganic thin films may include at least one silicon nitride layer and at least one silicon oxide layer.

At least a portion of the data line DL (see FIG. 3) and the power line PL (see FIG. 3) may be disposed on the interlayer insulating layer ILD. First electrodes ED1 and second electrodes ED2 of the transistors T1 and T2 may be disposed on the interlayer insulating layer ILD.

The first electrodes ED1 and the second electrodes ED2 may each be connected to a corresponding active portion ACL of the active portions ACL through a corresponding contact hole of contact holes penetrating through the gate insulating layers GI1 and GI2 and the interlayer insulating layer ILD.

The circuit insulating layer VIA covering the first electrodes ED1 and the second electrodes ED2 is disposed on the interlayer insulating layer ILD. The circuit insulating layer VIA may include an organic film and/or an inorganic film. The circuit insulating layer VIA may provide a flat surface.

The pixel defining film PDL and the organic light emitting element OLED are disposed on the circuit insulating layer VIA.

The organic light emitting element OLED may include the anode AE, a hole control layer HL, a light emitting layer EML, an electron control layer EL, and a cathode CE. Referring to FIG. 4, the cathode CE of the organic light emitting element OLED may be connected to the second power source ELVSS.

Figure 7:
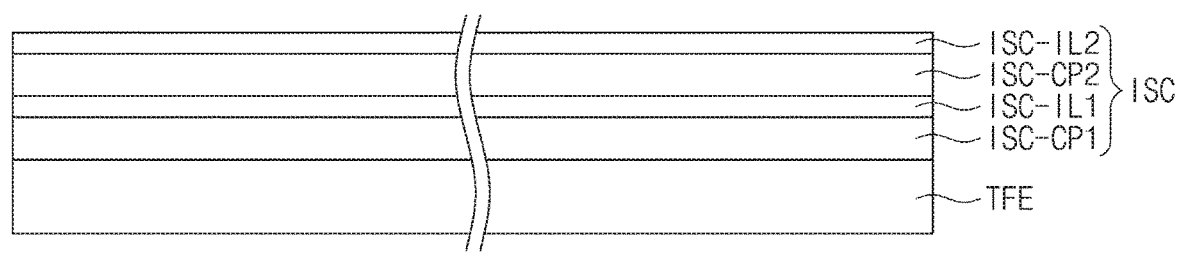
FIG. 7 is a cross-sectional view of an input sensing circuit according to an embodiment of the inventive concept.
Figure 7:
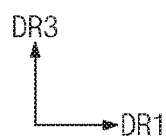

FIG. 7 is a cross-sectional view of the input sensing circuit ISC according to an embodiment of the inventive concept.

As illustrated in FIG. 7, the input sensing circuit ISC may include a first conductive pattern ISC-CP1, a first input insulating layer ISC-IL1, a second conductive pattern ISC-CP2, and a second input insulating layer ISC-IL2. The first conductive pattern ISC-CP1 may be directly disposed on the encapsulation layer TFE of the display panel DP. Accordingly, the first conductive pattern ISC-CP1 may come in contact with the encapsulation layer TFE.

However, an embodiment of the inventive concept is not limited thereto, and an inorganic layer (e.g., a buffer layer) or an optically clear adhesive member OCA (see FIG. 2C) may further be disposed between the first conductive pattern ISC-CP1 and the encapsulation layer TFE.

At least a portion of the second conductive pattern ISC-CP2 may be insulated from the first conductive pattern ISC-CP1 with the first input insulating layer ISC-IL1 interposed therebetween.

Each of the first conductive pattern ISC-CP1 and the second conductive pattern ISC-CP2 may have a single layer structure, or a multilayer structure including a plurality of layers laminated in the third direction DR3.

Each of the first input insulating layer ISC-IL1 and the second input insulating layer ISC-IL2 may include an inorganic material or an organic material. The inorganic material may include at least one of aluminum oxide, titanium oxide, silicon oxide, silicon nitride, silicon oxynitride, zirconium oxide, and hafnium oxide. The organic material may include at least one of acrylic resin, methacrylic resin, polyisoprene, vinyl resin, epoxy resin, urethane resin, cellulose resin, siloxane resin, polyimide resin, polyamide resin, and perylene resin.

It suffices that the first input insulating layer ISC-IL1 insulates the first conductive pattern ISC-CP1 and the second conductive pattern ISC-CP2 from each other, and the shape of the first input insulating layer ISC-IL1 is not limited to a particular shape. In an embodiment of the inventive concept, the first input insulating layer ISC-IL1 may cover the entirety of the encapsulation layer TFE, or may include a plurality of insulating patterns.

Figure 8:
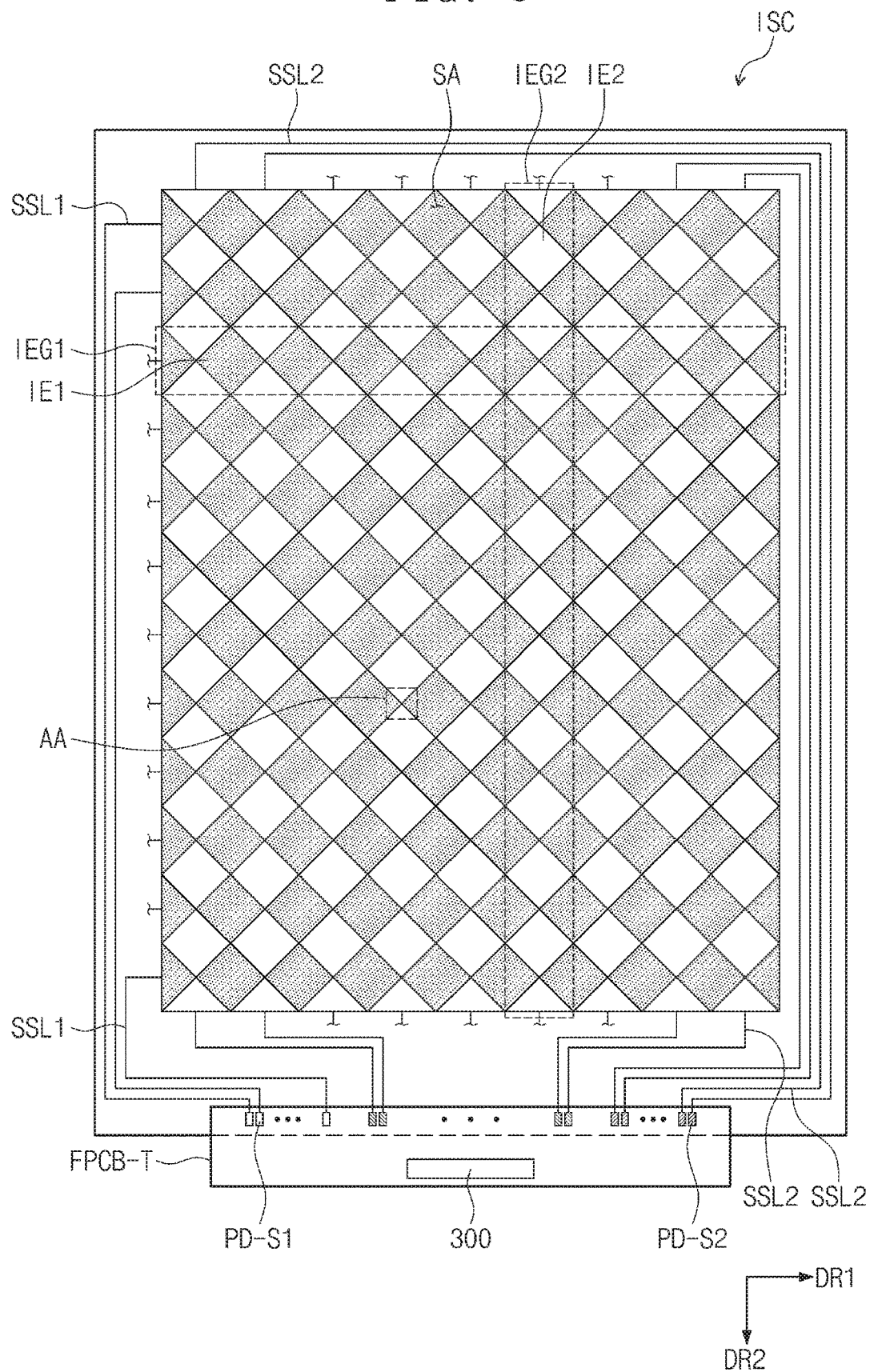
FIG. 8 is a plan view of the input sensing circuit according to an embodiment of the inventive concept.

FIG. 8 is a plan view of the input sensing circuit ISC according to an embodiment of the inventive concept.

An input sensing region SA in which an external input may be sensed may be defined in the input sensing circuit ISC.

The input sensing circuit ISC may include first sensor groups IEG1, second sensor groups IEG2, first signal lines SSL1, second signal lines SSL2, signal pads PD-S1 and PD-S2, a printed circuit board FPCB-T, and an input sensing driver 300.

Each of the first sensor groups IEG1 may extend in the first direction DR1, and the first sensor groups IEG1 may be arranged in the second direction DR2. Each of the first sensor groups IEG1 may include a plurality of first sensor patterns IE1 (hereinafter also referred to as first sensors IE1). For example, a first sensor IE1 may be an Rx (receiving) sensor.

Each of the second sensor groups IEG2 may extend in the second direction DR2, and the second sensor groups IEG2 may be arranged in the first direction DR1. Each of the second sensor groups IEG2 may include a plurality of second sensor patterns IE2 (hereinafter also referred to as second sensors IE2). For example, a second sensor IE2 may be a Tx (transmitting) sensor.

In an embodiment of the inventive concept, the length of a first sensor group IEG1 measured in the first direction DR1 may be shorter than the length of a second sensor group IEG2 measured in the second direction DR2. However, an embodiment of the inventive concept is not limited thereto.

In an embodiment of the inventive concept, each of the first sensors IE1 may be electrostatically coupled to one or more adjacent second sensors IE2 of the second sensors IE2 to form capacitance. In an embodiment of the inventive concept, each of the first sensors IE1 and the second sensors IE2 may be electrostatically coupled to an external object (for example, a person's finger) to form capacitance.

In an embodiment of the inventive concept, the input sensing circuit ISC may determine whether an external input is applied, by sensing a change of capacitance formed between the first sensors IE1 and the second sensors IE2. In another embodiment of the inventive concept, the input sensing circuit ISC may determine whether an external input is applied, by sensing a change of capacitance formed between an external object and the first to second sensors IE1 to IE2.

The first signal lines SSL1 may be electrically connected to the first sensor groups IEG1 respectively. In an embodiment of the inventive concept, the first signal lines SSL1 may be connected to the first sensor groups IEG1 in a single routing structure. For example, each of the first sensor groups IEG1 is electrically connected to a respective one of the first signal lines SSL1 on the left side as illustrated in FIG. 8. However, the structure is not limited thereto. In another embodiment of the inventive concept, the first signal lines SSL1 may be connected to the first sensor groups IEG1 in a double routing structure.

The second signal lines SSL2 may be electrically connected to the second sensor groups IEG2 respectively. In an embodiment of the inventive concept, the second signal lines SSL2 may be connected to the second sensor groups IEG2 in a double routing structure. For example, each of the second sensor groups IEG2 is electrically connected to a respective one of the second signal lines SSL2 on the top and the bottom sides as illustrated in FIG. 8. However, the structure is not limited thereto. In another embodiment of the inventive concept, the second signal lines SSL2 may be connected to the second sensor groups IEG2 in a single routing structure.

First signal pads PD-S1 may be connected to the first signal lines SSL1, respectively. Second signal pads PD-S2 may be connected to the second signal lines SSL2, respectively.

The signal pads PD-S1 and PD-S2 may be disposed on the printed circuit board FPCB-T.

The input sensing driver 300 may be mounted on the printed circuit board FPCB-T. The input sensing driver 300 may calculate, and/or transmit/receive an electrical signal for determining a location of a touch input from a user in the input sensing region SA and/or an amount of pressure applied to the input sensing region SA.

Figure 9A:
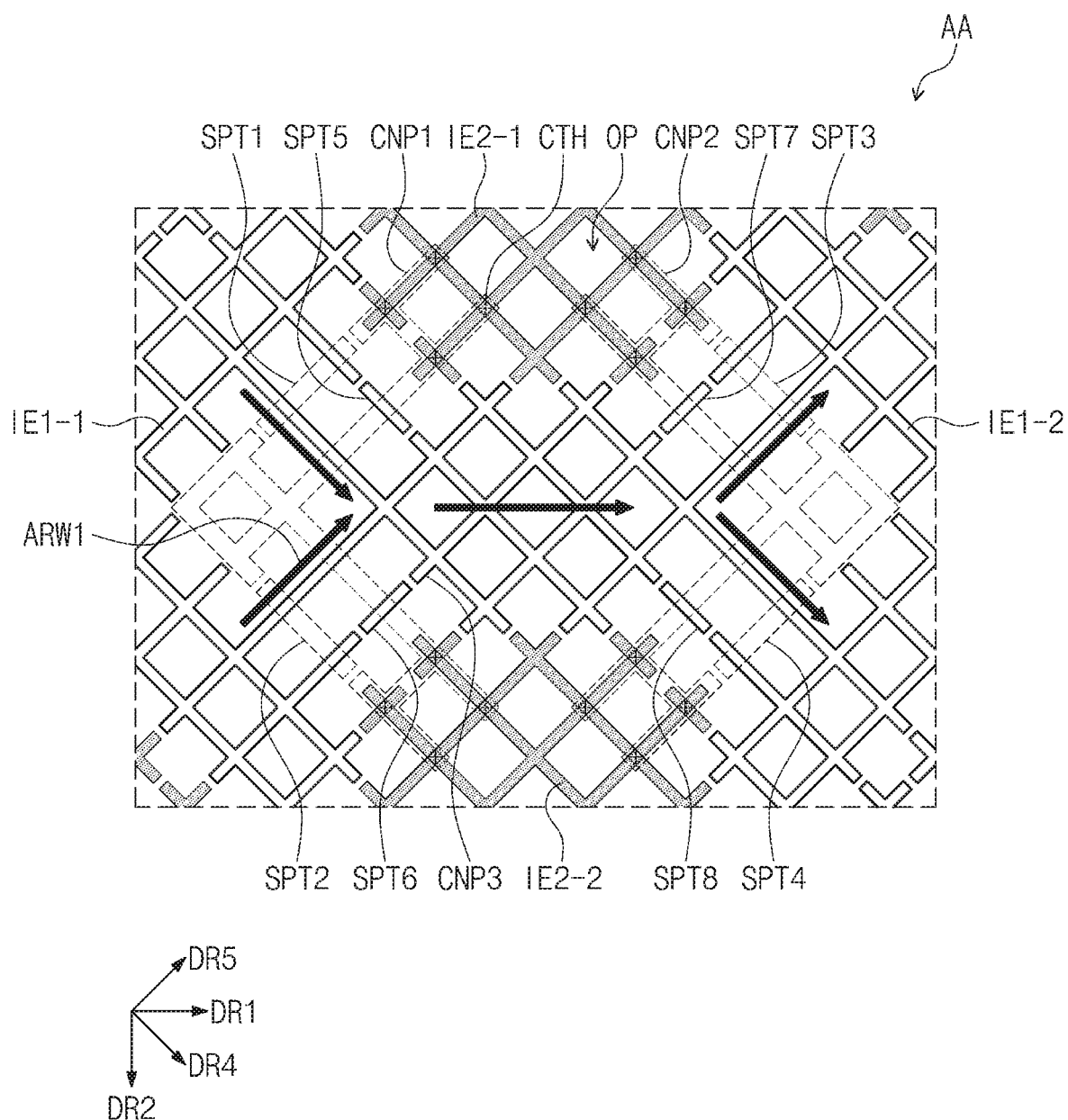
FIGS. 9A and 9B are each an enlarged view of AA region illustrated in FIG. 8.
Figure 9B:
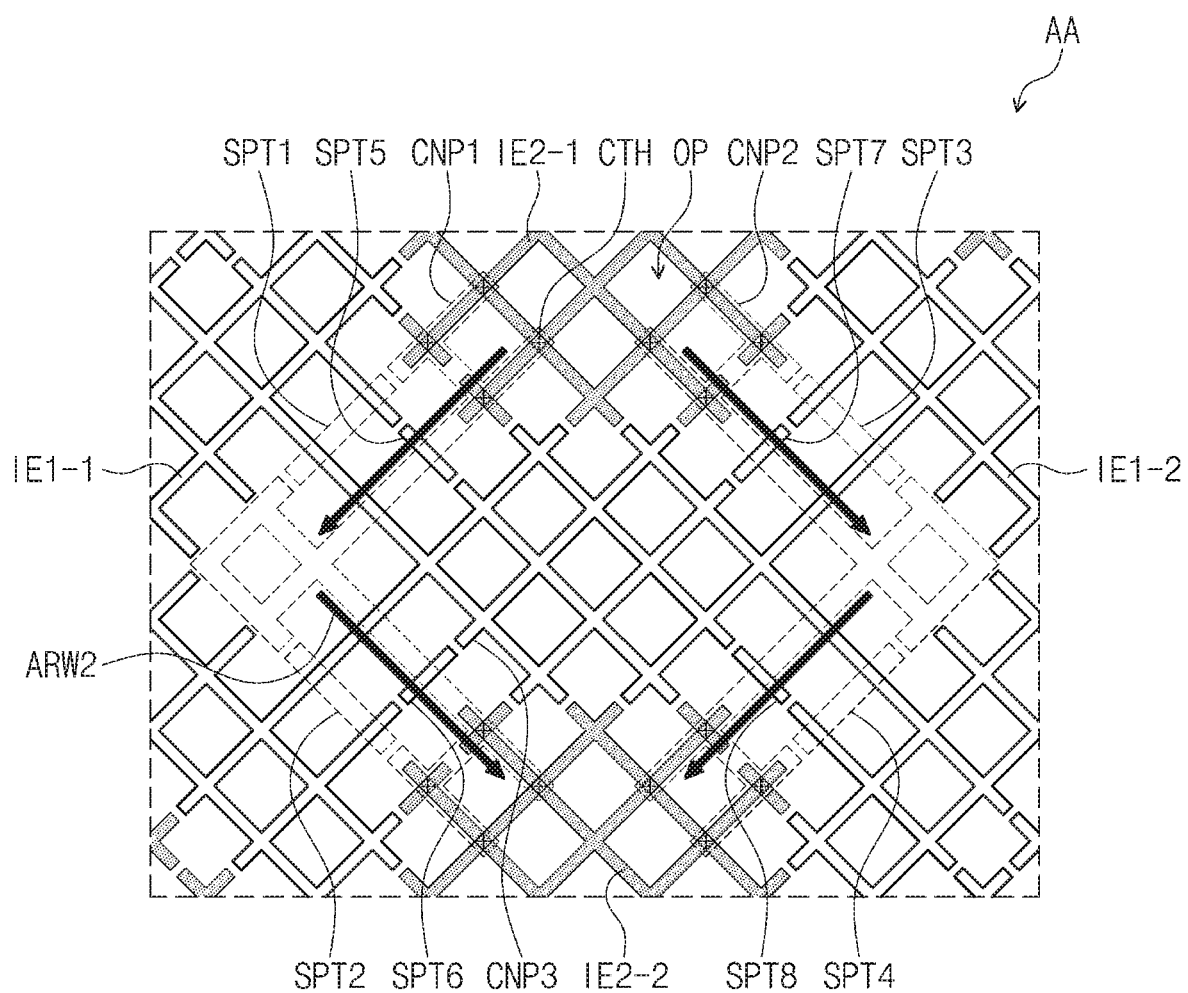
Figure 10A:
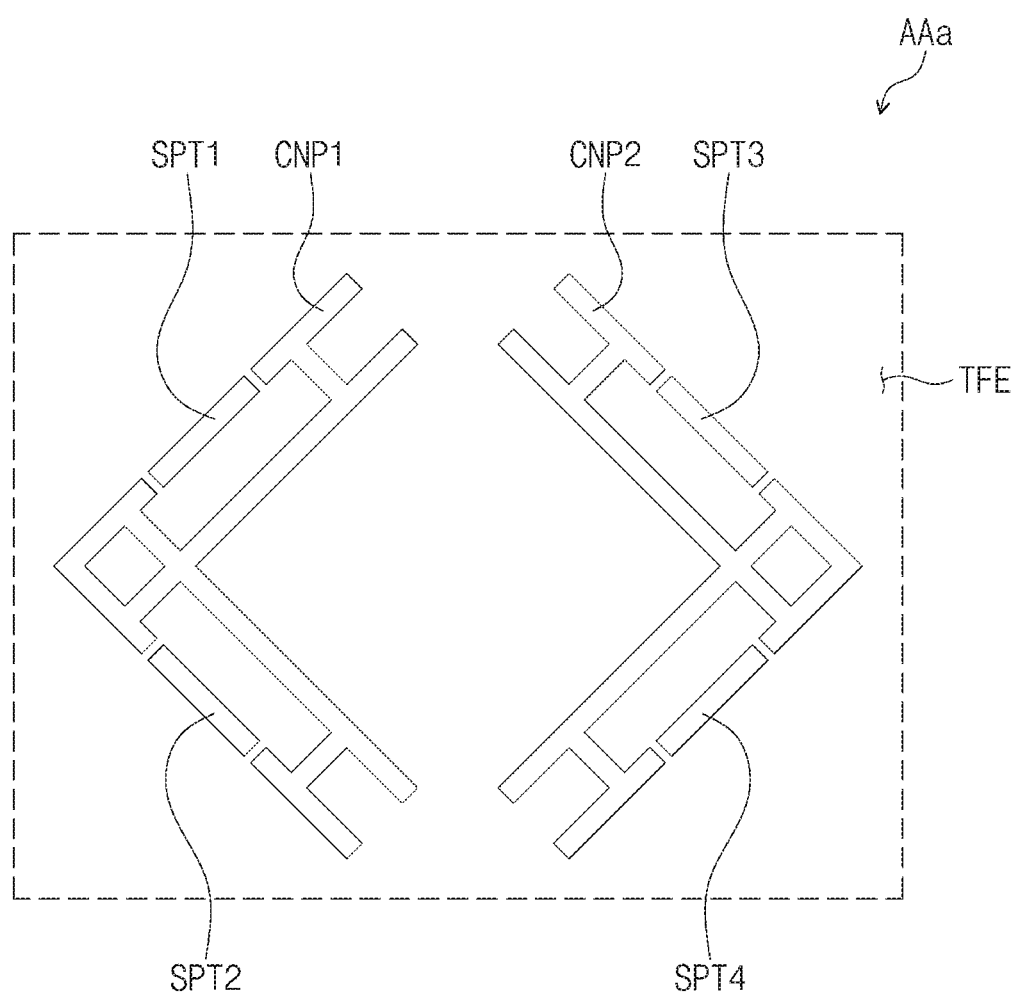
FIGS. 10A, 10B, and 10C each illustrate, by layer, the AA region illustrated in FIG. 8.
Figure 10B:
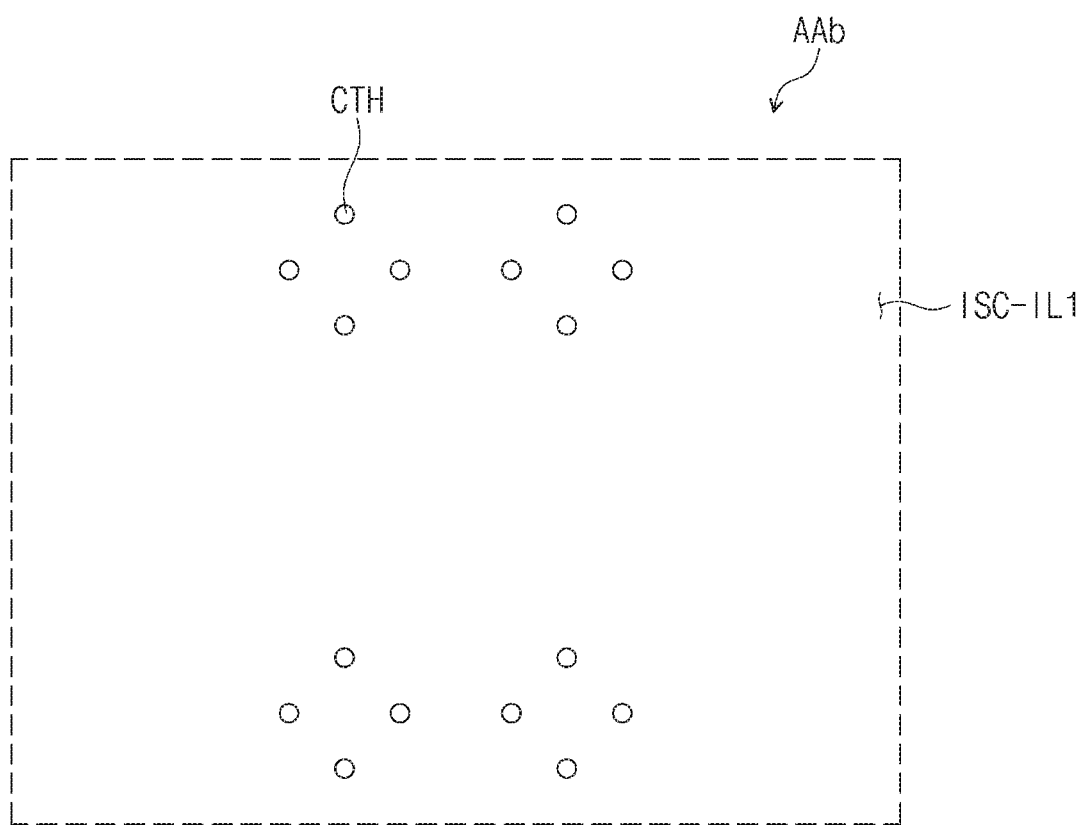
Figure 10C:
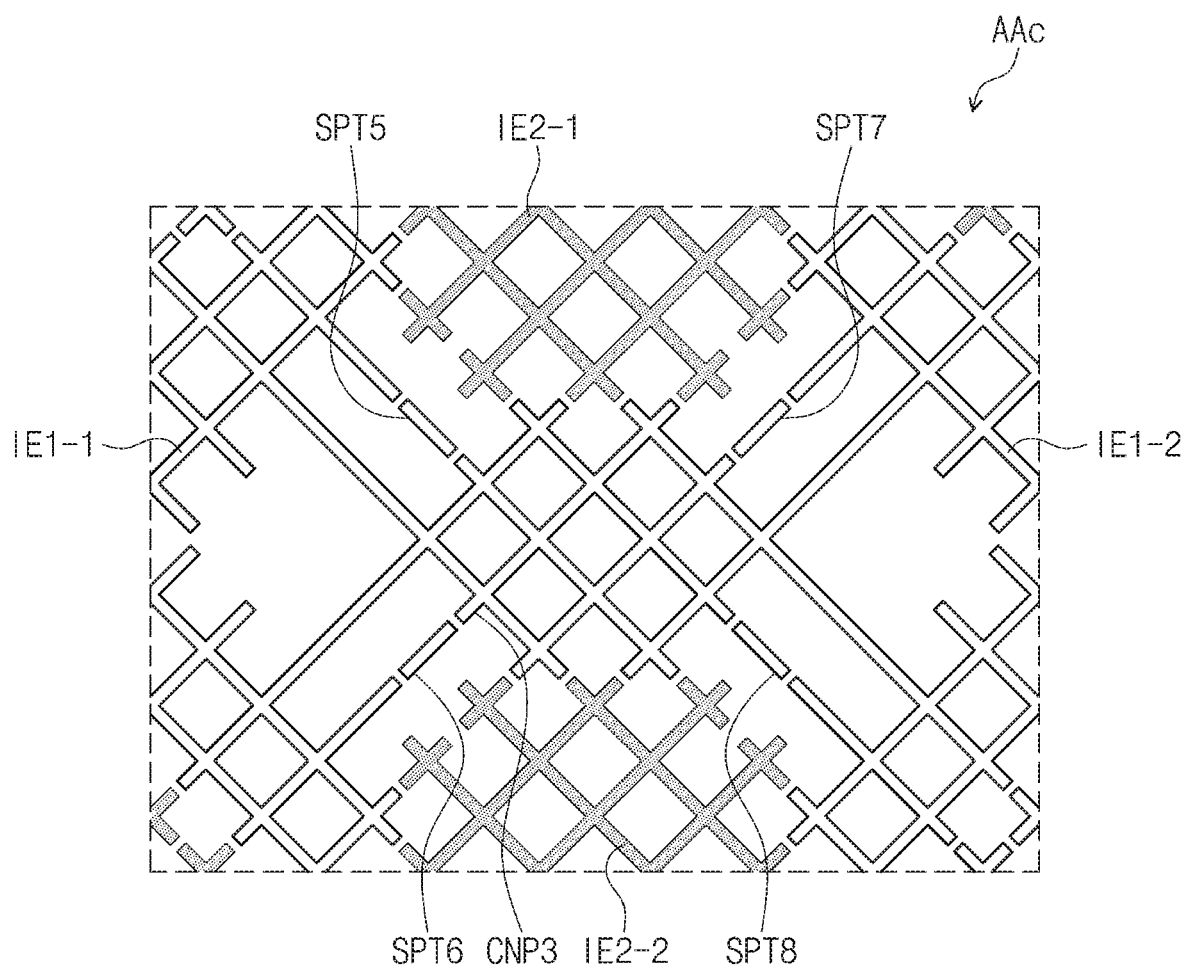

FIGS. 9A and 9B are each an enlarged view of AA region illustrated in FIG. 8. FIGS. 10A, 10B, and 10C each illustrate, by layer, the AA region illustrated in FIG. 8.

FIG. 9A illustrates a first signal flow ARW1 between first sensors IE1-1 and IE1-2 in the AA region, and FIG. 9B illustrates a second signal flow ARW2 between second sensors IE2-1 and IE2-2 in the AA region.

FIG. 10A illustrates AAa region in which a portion, corresponding to the AA region, of the first conductive pattern ISC-CP1 is illustrated. FIG. 10B illustrates AAb region in which a portion, corresponding to the AA region, of the first input insulating layer ISC-IL1 is illustrated. FIG. 10C illustrates AAc region in which a portion, corresponding to the AA region, of the second conductive pattern ISC-CP2 is illustrated.

It is noted that an embodiment in which the first conductive pattern ISC-CP1 is disposed below the second conductive pattern ISC-CP2 is illustrated in FIG. 7, FIGS. 9A to 9B, and FIGS. 10A to 10C, but the inventive concept of the present disclosure is not limited thereto. In another embodiment of the inventive concept, the second conductive pattern ISC-CP2 may be disposed below the first conductive pattern ISC-CP1.

Referring to FIGS. 7 and 10A, in an embodiment of the inventive concept, the first conductive pattern ISC-CP1 may include a first connection pattern CNP1, a second connection pattern CNP2, and sub-patterns SPT1, SPT2, SPT3, and SPT4. The first connection pattern CNP1, the second connection pattern CNP2, and the sub-patterns SPT1, SPT2, SPT3, and SPT4 may be disposed on the encapsulation layer TFE of the display panel DP.

The first connection pattern CNP1 and the second connection pattern CNP2 may be disposed to be spaced apart from each other in the first direction DR1. The first connection pattern CNP1 and the second connection pattern CNP2 are patterns for connecting adjacent ones of the second sensors IE2 (see FIG. 8) in the second direction DR2.

Each of the sub-patterns SPT1, SPT2, SPT3, and SPT4 may be in a floating state. Each of the sub-patterns SPT1, SPT2, SPT3, and SPT4 may be insulated from the first connection pattern CNP1 and the second connection pattern CNP2.

A first sub-pattern SPT1 and a second sub-pattern SPT2 may be separated from each other in the second direction DR2 and disposed adjacent to the first connection pattern CNP1. In an embodiment of the inventive concept, the first sub-pattern SPT1, the second sub-pattern SPT2, and the first connection pattern CNP1 may be initially formed as a single pattern, and then divided into the three separate patterns through a subsequent process. For example, the first sub-pattern SPT1, the second sub-pattern SPT2, and the first connection pattern CNP1 may be separated through a cutting process or an etching process.

A third sub-pattern SPT3 and a fourth sub-pattern SPT4 may be separated from each other in the second direction DR2 and disposed adjacent to the second connection pattern CNP2. In an embodiment of the inventive concept, the third sub-pattern SPT3, the fourth sub-pattern SPT4, and the second connection pattern CNP2 may be initially formed as a single pattern, and then divided into the three separate patterns through a subsequent process. For example, the third sub-pattern SPT3, the fourth sub-pattern SPT4, and the second connection pattern CNP2 may be separated through a cutting process or an etching process.

Referring to FIG. 10B, a plurality of contact holes CTH may be defined in the first input insulating layer ISC-IL1. The contact holes CTH may expose at least a portion of the first connection pattern CNP1 and at least a portion of the second connection pattern CNP2. Specifically, the contact holes CTH may expose both ends of the first connection pattern CNP1 and both ends of the second connection pattern CNP2 in the second direction DR2.

Although FIG. 10B exemplarily illustrates 16 contact holes CTH, the number of the contact holes CTH is not limited thereto, and may be changed as needed without deviating from the scope of the present disclosure.

Referring to FIGS. 7 and 10C, in an embodiment of the inventive concept, the second conductive pattern ISC-CP2 may include the first sensors IE1-1 and IE1-2, the second sensors IE2-1 and IE2-2 that are insulated and separated from the first sensors IE1-1 and IE1-2, a third connection pattern CNP3, and sub-patterns SPT5, SPT6, SPT7, and SPT8. The first sensors IE1-1 and IE1-2, the second sensors IE2-1 and IE2-2, the third connection pattern CNP3, and the sub-patterns SPT5, SPT6, SPT7, and SPT8 of the second conductive pattern ISC-CP2 may be disposed on the first input insulating layer ISC-IL1.

The left first sensor IE1-1 and the right first sensor IE1-2 may be electrically connected by the third connection pattern CNP3.

The upper second sensor IE2-1 and the lower second sensor IE2-2 may be electrically connected to the first connection pattern CNP1 and the second connection pattern CNP2 through the contact holes CTH of the first input insulating layer ISC-IL1. Accordingly, the upper second sensor IE2-1 and the lower second sensor IE2-2 may be electrically connected by the first connection pattern CNP1 and the second connection pattern CNP2.

The third connection pattern CNP3 may be disposed between the upper second sensor IE2-1 and the lower second sensor IE2-2 in the second direction DR2. The third connection pattern CNP3 may be insulated and separated from the upper second sensor IE2-1 and the lower second sensor IE2-2.

Each of the sub-patterns SPT5, SPT6, SPT7, and SPT8 may be in a floating state. Each of the sub-patterns SPT5, SPT6, SPT7, and SPT8 may be insulated from the first sensors IE1-1 and IE1-2, the second sensors IE2-1 and IE2-2, and the third connection pattern CNP3.

A fifth sub-pattern SPT5 and a sixth sub-pattern SPT6 may be separated from each other in the second direction DR2 and disposed between the third connection pattern CNP3 and the left first sensor IE1-1.

A seventh sub-pattern SPT7 and an eighth sub-pattern SPT8 may be separated from each other in the second direction DR2 and disposed between the third connection pattern CNP3 and the right first sensor IE1-2.

In an embodiment of the inventive concept, the first sensors IE1-1 and IE1-2, the second sensors IE2-1 and IE2-2, the third connection pattern CNP3, and the sub-patterns SPT5, SPT6, SPT7, and SPT8 may be initially formed as a single pattern, and then divided into a plurality of the patterns through a subsequent process. For example, the first sensors IE1-1 and IE1-2, the second sensors IE2-1 and IE2-2, the third connection pattern CNP3, and the sub-patterns SPT5, SPT6, SPT7, and SPT8 may be separated through a cutting process or an etching process.

Referring to FIG. 9A, a direction between the first direction DR1 and the second direction DR2 may be defined as a fourth direction DR4. A fifth direction DR5 may be defined as a direction perpendicular to the fourth direction DR4. For example, the fourth direction DR4 may be at 45 degrees with respect to each of the first direction DR1 and the second direction DR2. The fifth direction DR5 may be at 45 degrees with respect to the first direction DR1 and 135 degrees with respect to the second direction DR2.

Wires forming the first conductive pattern ISC-CP1 and the second conductive pattern ISC-CP2 may extend substantially in a direction parallel to the fourth direction DR4 or the fifth direction DR5 in the AA region.

A plurality of openings OP may be defined between the wires forming the first conductive pattern ISC-CP1 and the second conductive pattern ISC-CP2 in the AA region. In an embodiment of the inventive concept, the openings OP may respectively correspond to the pixels PX (see FIG. 3).

Each of the openings OP may expose the organic light emitting element OLED (see FIG. 4) of the pixel PX (see FIG. 4). In other words, light generated in the organic light emitting element OLED (see FIG. 4) may be emitted to the outside through the corresponding opening OP.

Referring to FIGS. 9A and 9B, the fifth sub-pattern SPT5 and the sixth sub-pattern SPT6 are disposed to overlap at least a portion of the first connection pattern CNP1, and the seventh sub-pattern SPT7 and the eighth sub-pattern SPT8 are disposed to overlap at least a portion of the second connection pattern CNP2.

When a defect occurs in the first input insulating layer ISC-IL1, there may occur a first short circuit defect by which at least one of the fifth sub-pattern SPT5 or the sixth sub-pattern SPT6 is electrically connected to the first connection pattern CNP1, or a second short circuit defect by which at least one of the seventh sub-pattern SPT7 or the eighth sub-pattern SPT8 is electrically connected to the second connection pattern CNP2.

According to an embodiment of the inventive concept, even if the first short circuit defect or the second short circuit defect occurs, the first signal flow ARW1 (see FIG. 9A) between the first sensors IE1-1 and IE1-2 and the second signal flow ARW2 (see FIG. 9B) between the second sensors IE2-1 and IE2-2 are not disturbed because the fifth to eighth sub-patterns SPT5 to SPT8 are in a floating state. Accordingly, the touch sensing capability of the input sensing circuit ISC would not be affected even if a defect caused by a short circuit may occur in the first input insulating layer ISC-IL1 because the electrical signal flows ARW1 and ARW2 are not disturbed within the input sensing circuit ISC.

Figure 11:
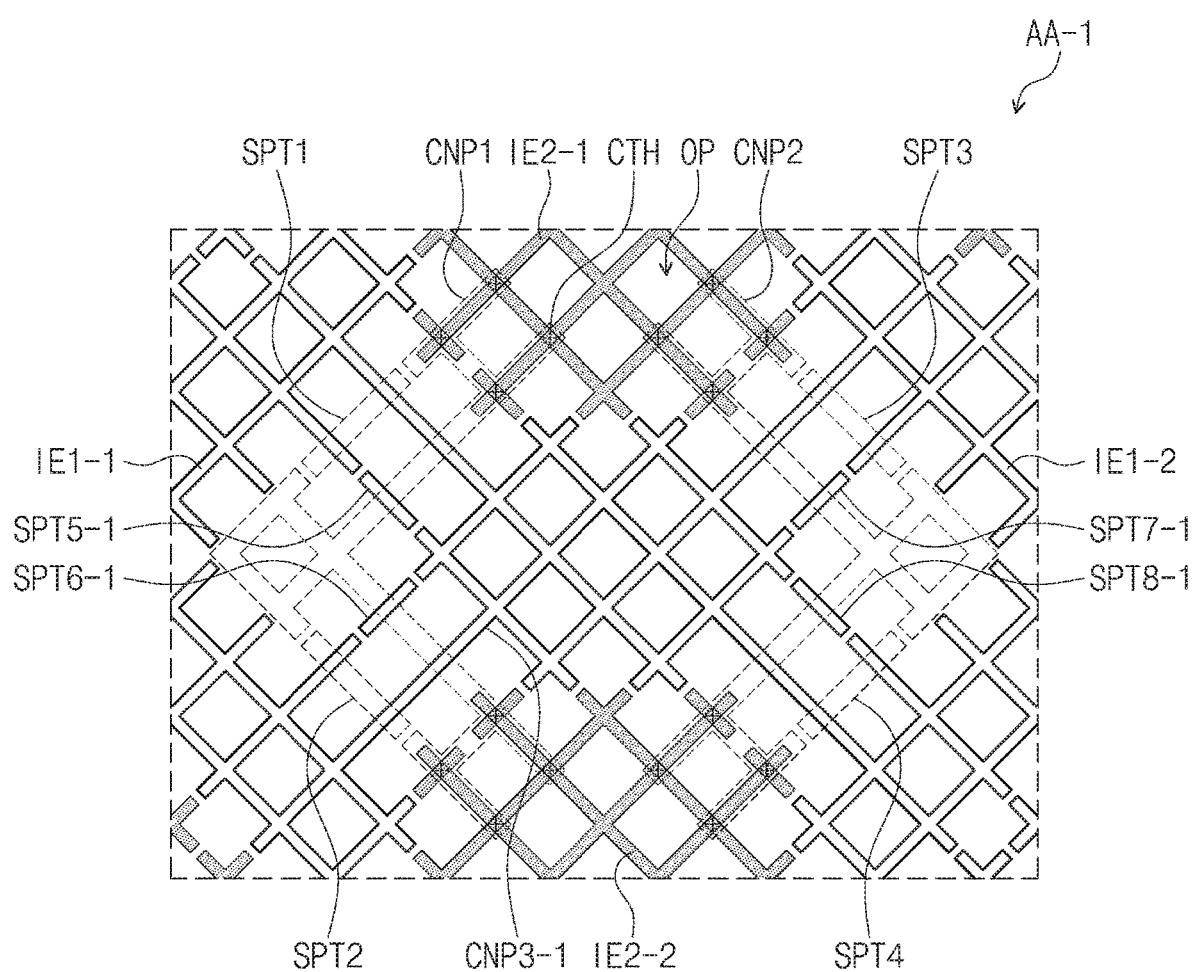
FIGS. 11 and 12 each illustrate a modified embodiment of the AA region illustrated in FIG. 9A.
Figure 12:
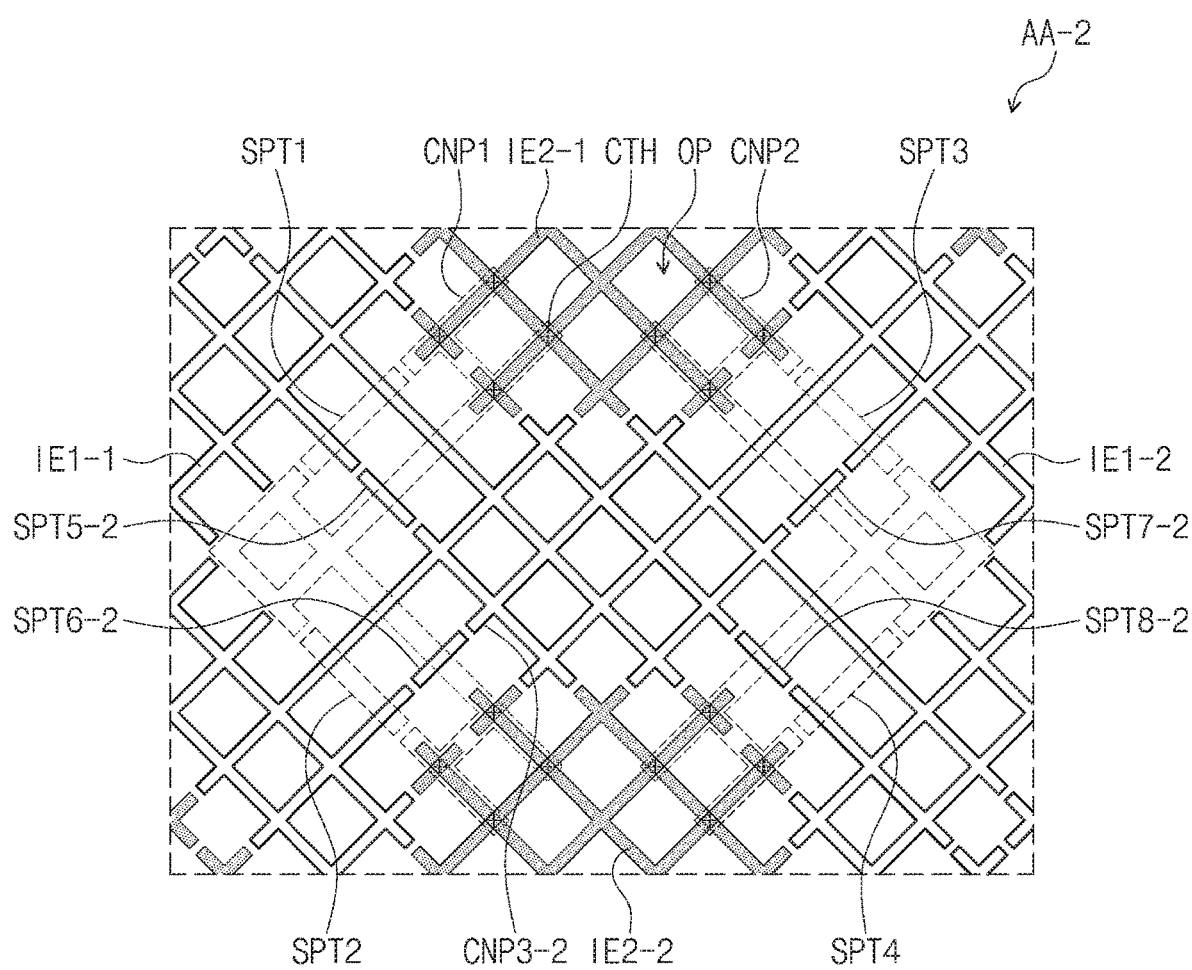

FIGS. 11 and 12 each illustrate a modified embodiment of the AA region illustrated in FIG. 9A.

Referring to FIG. 11, the positions of sub-patterns SPT5-1, SPT6-1, SPT7-1, and SPT8-1 in AA-1 region are different from the positions of the sub-patterns SPT5, SPT6, SPT7, and SPT8 in the AA region illustrated in FIG. 9A. According thereto, the shape of a third connection pattern CNP3-1 in the AA-1 region may be different from the shape of the third connection pattern CNP3 in the AA region.

The sub-patterns SPT5, SPT6, SPT7, and SPT8 may be disposed at outer positions from the third connection pattern CNP3 in FIG. 9A, but the sub-patterns SPT5-1, SPT6-1, SPT7-1, and SPT8-1 may be disposed at inner positions from the third connection pattern CNP3-1 in FIG. 11.

Specifically, in FIG. 9A, the fifth sub-pattern SPT5 and the sixth sub-pattern SPT6 are disposed at the outer positions from portions at which the left first sensor IE1-1 and the third connection pattern CNP3 are connected. Additionally, the seventh sub-pattern SPT7 and the eighth sub-pattern SPT8 are disposed at the outer positions from portions at which the right first sensor IE1-2 and the third connection pattern CNP3 are connected.

On the contrary, in FIG. 11, a fifth sub-pattern SPT5-1 and a sixth sub-pattern SPT6-1 are disposed at the inner positions from portions at which a left first sensor IE1-1 and the third connection pattern CNP3-1 are connected. Additionally, a seventh sub-pattern SPT7-1 and an eighth sub-pattern SPT8-1 are disposed at the inner positions from portions at which the right first sensor IE1-2 and the third connection pattern CNP3-1 are connected.

In other words, in FIG. 9A, the fifth sub-pattern SPT5 is disposed between the portion at which the left first sensor IE1-1 and the third connection pattern CNP3 are connected and the upper second sensor IE2-1, and the sixth sub-pattern SPT6 is disposed between the portion at which the left first sensor IE1-1 and the third connection pattern CNP3 are connected and the lower second sensor IE2-2. In addition, in FIG. 9A, the seventh sub-pattern SPT7 is disposed between the portion at which the right first sensor IE1-2 and the third connection pattern CNP3 are connected and the upper second sensor IE2-1, and the eighth sub-pattern SPT8 is disposed between the portion at which the right first sensor IE1-2 and the third connection pattern CNP3 are connected and the lower second sensor IE2-2.

On the contrary, in FIG. 11, the portion at which the left first sensor IE1-1 and the third connection pattern CNP3-1 are connected is disposed between the fifth sub-pattern SPT5-1 and the upper second sensor IE2-1, or is disposed between the sixth sub-pattern SPT6-1 and the lower second sensor IE2-2. In addition, in FIG. 11, the portion at which the right first sensor IE1-2 and the third connection pattern CNP3-1 are connected is disposed between the seventh sub-pattern SPT7-1 and the upper second sensor IE2-1, or is disposed between the eighth sub-pattern SPT8-1 and the lower second sensor IE2-2.

Other descriptions related to FIG. 11 are substantially the same as those provided with reference to FIGS. 9A to 10C, and thus will be omitted.

Referring to FIG. 12, the positions of a fifth sub-pattern SPT5-2 and a seventh sub-pattern SPT7-2 among the sub-patterns SPT5-2 and SPT7-2 and sub-patterns SPT6-2 and SPT8-2 in AA-2 region may be substantially the same as the positions of the fifth sub-pattern SPT5-1 and the seventh sub-pattern SPT7-1 in the AA-1 region illustrated in FIG. 11, and the positions of a sixth sub-pattern SPT6-2 and an eighth sub-pattern SPT8-2 may be substantially the same as the positions of the sixth sub-pattern SPT6 and the eighth sub-pattern SPT8 in the AA region illustrated in FIG. 9.

According thereto, the shape of a third connection pattern CNP3-2 in the AA-2 region may be different from the shape of the third connection pattern CNP3 in the AA region illustrated in FIG. 9 and the shape of the third connection pattern CNP3-1 in the AA-1 region illustrated in FIG. 11.

According to an embodiment of the inventive concept, by floating some portions of wires in which a short circuit may occur, the operation of the input sensing circuit may not be affected by a short circuit that may occur between the wires. Accordingly, an input sensing circuit having a low defect rate and a display module including the input sensing circuit may be provided.

Although the exemplary embodiments of the inventive concept of the present disclosure have been described herein, it is understood that various changes and modifications can be made by those skilled in the art within the spirit and scope of the inventive concept defined by the following claims or the equivalents. The exemplary embodiments described herein are not intended to limit the technical spirit and scope of the present disclosure, and technical spirit within the scope of the following claims or the equivalents will be construed as being included in the scope of the present disclosure.

What is claimed is:

1. An input sensing circuit comprising:
   a base layer;
   a first conductive pattern disposed on the base layer and including a first connection pattern, a second connection pattern spaced apart from the first connection pattern, and first to fourth sub-patterns, each of which is disposed adjacent to the first connection pattern or the second connection pattern, and is in a floating state;
   an insulating layer disposed above the base layer covering the first conductive pattern and including a plurality of contact holes exposing both ends of the first connection pattern and both ends of the second connection pattern; and
   a second conductive pattern disposed on the insulating layer,
   wherein the second conductive pattern comprises:
      a plurality of first sensor patterns arranged in a first direction;
      a plurality of second sensor patterns arranged in a second direction crossing the first direction, and each of the plurality of second sensor patterns is electrically connected to the first connection pattern and the second connection pattern through some of the plurality of contact holes;
      a third connection pattern disposed between adjacent two of the plurality of second sensor patterns, and configured to electrically connect adjacent two of the plurality of first sensor patterns; and
      fifth to eighth sub-patterns, each of which is disposed between corresponding one of the plurality of first sensor patterns and the third connection pattern, and is in a floating state.

2. The input sensing circuit of claim 1, wherein each of the first to fourth sub-patterns overlaps at least one among one of the first sensor patterns and the third connection pattern.

3. The input sensing circuit of claim 2, wherein each of the fifth to eighth sub-patterns overlaps at least one of the first connection pattern and the second connection pattern.

4. The input sensing circuit of claim 3, wherein each of the first conductive pattern and the second conductive pattern has a mesh shape having a plurality of openings defined therein.

5. The input sensing circuit of claim 4, wherein each of the fifth to eighth sub-patterns is disposed at an outer position from wires included in the third connection pattern.

6. The input sensing circuit of claim 4, wherein each of the fifth to eighth sub-patterns is disposed at an inner position from wires included in the third connection pattern.

7. The input sensing circuit of claim 4, wherein each of the first to eighth sub-patterns extends in a third direction between the first direction and the second direction, or a fourth direction perpendicular to the third direction.

8. The input sensing circuit of claim 7, wherein at least some of wires included in each of the plurality of first sensor patterns, the plurality of second sensor patterns, the first connection pattern, the second connection pattern, and the third connection pattern extend in the third direction or the fourth direction.

9. The input sensing circuit of claim 3, further comprising:
   a first signal line connected to at least one of the plurality of first sensor patterns;
   a second signal line connected to at least one of the plurality of second sensor patterns; and
   an input sensing driver configured to provide an electrical signal to the first signal line and the second signal line.

10. An input sensing circuit comprising:
    a first conductive pattern including a first connection pattern, a second connection pattern spaced apart from the first connection pattern, and first to fourth sub-patterns, each of which is disposed adjacent to the first connection pattern or the second connection pattern, and is in a floating state;
    an insulating layer disposed below the first conductive pattern and including a plurality of contact holes overlapping both ends of the first connection pattern and both ends of the second connection pattern; and
    a second conductive pattern disposed below the insulating layer,
    wherein the second conductive pattern comprises:
       a plurality of first sensor patterns arranged in a first direction;
       a plurality of second sensor patterns arranged in a second direction crossing the first direction, and each of the plurality of second sensor patterns is electrically connected to the first connection pattern and the second connection pattern through some of the plurality of contact holes;
       a third connection pattern disposed between adjacent two of the plurality of second sensor patterns, and configured to electrically connect adjacent two of the plurality of first sensor patterns; and
       fifth to eighth sub-patterns, each of which is disposed between corresponding one of the plurality of first sensor patterns and the third connection pattern, and is in a floating state.

11. The input sensing circuit of claim 10, wherein each of the first to fourth sub-patterns overlaps at least one among one of the first sensor patterns and the third connection pattern.

12. The input sensing circuit of claim 11, wherein each of the fifth to eighth sub-patterns overlaps at least one of the first connection pattern and the second connection pattern.

13. The input sensing circuit of claim 12, wherein each of the first conductive pattern and the second conductive pattern has a mesh shape having a plurality of openings defined therein.

14. The input sensing circuit of claim 13, wherein each of the fifth to eighth sub-patterns is disposed at an outer position from wires included in the third connection pattern.

15. The input sensing circuit of claim 13, wherein each of the fifth to eighth sub-patterns is disposed at an inner position from wires included in the third connection pattern.

16. The input sensing circuit of claim 13, wherein each of the first to eighth sub-patterns extends in a third direction between the first direction and the second direction, or a fourth direction perpendicular to the third direction.

17. The input sensing circuit of claim 16, wherein at least some of wires included in each of the plurality of first sensor patterns, the plurality of second sensor patterns, the first connection pattern, the second connection pattern, and the third connection pattern extend in the third direction or the fourth direction.

18. A display module comprising:
a display panel including a light emitting element layer having a light emitting element, and an encapsulation layer sealing the light emitting element layer; and
an input sensing circuit disposed on the display panel and including a first conductive pattern disposed on the encapsulation layer, an insulating layer covering the first conductive pattern, and a second conductive pattern disposed on the insulating layer, wherein
the first conductive pattern comprises:
   a first connection pattern;
   a second connection pattern spaced apart from the first connection pattern; and
   first to fourth sub-patterns, each of which is disposed adjacent to the first connection pattern or the second connection pattern, and is in a floating state,
the insulating layer comprises a plurality of contact holes exposing at least a portion of the first connection pattern and at least a portion of the second connection pattern, and
the second conductive pattern comprises:
   a plurality of first sensor patterns arranged in a first direction;
   a plurality of second sensor patterns arranged in a second direction crossing the first direction, and each of the plurality of second sensor patterns is electrically connected to the first connection pattern and the second connection pattern through some of the plurality of contact holes;
   a third connection pattern disposed between adjacent two of the plurality of second sensor patterns, and configured to electrically connect adjacent two of the plurality of first sensor patterns; and
   fifth to eighth sub-patterns, each of which is disposed between corresponding one of the plurality of first sensor patterns and the third connection pattern, and is in a floating state.

19. The display module of claim 18, wherein the first conductive pattern is in contact with the encapsulation layer.

20. The display module of claim 19, wherein
each of the first to fourth sub-patterns overlaps at least one among one of the first sensor patterns and the third connection pattern, and
each of the fifth to eighth sub-patterns overlaps at least one of the first connection pattern and the second connection pattern.

\* \* \* \* \*